US006815621B2

(12) United States Patent
Park et al.

(10) Patent No.: US 6,815,621 B2
(45) Date of Patent: Nov. 9, 2004

(54) CHIP SCALE PACKAGE, PRINTED CIRCUIT BOARD, AND METHOD OF DESIGNING A PRINTED CIRCUIT BOARD

(75) Inventors: Myun Joo Park, Inchon (KR); Byung Se So, Bundanggu (KR); Sang Won Lee, KunPo (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 09/799,094

(22) Filed: Mar. 6, 2001

(65) Prior Publication Data
US 2002/0038724 A1 Apr. 4, 2002

(30) Foreign Application Priority Data

Oct. 2, 2000 (KR) ........................................ 2000-57837

(51) Int. Cl.[7] ................................................. H05K 1/16
(52) U.S. Cl. ....................... 174/260; 174/262; 174/267; 257/690; 716/8
(58) Field of Search ................................. 174/260–261, 174/262–266; 361/767–774, 783; 257/690–697; 716/8–11

(56) References Cited
U.S. PATENT DOCUMENTS

| | | | | |
|---|---|---|---|---|
| 3,917,984 A | * | 11/1975 | Kong et al. ................. | 174/254 |
| 5,095,407 A | | 3/1992 | Kanezawa et al. | |
| 5,324,985 A | * | 6/1994 | Hamada et al. ............. | 257/697 |
| 5,448,451 A | * | 9/1995 | Takubo et al. ............... | 174/261 |
| 5,453,583 A | * | 9/1995 | Rostoker et al. ............. | 174/260 |
| 5,729,894 A | * | 3/1998 | Rostoker et al. ............. | 257/693 |
| 6,037,677 A | * | 3/2000 | Gottschall et al. ............ | 307/43 |
| 6,107,685 A | | 8/2000 | Nishiyama | |
| 6,125,042 A | | 9/2000 | Verdi et al. | |
| 6,204,559 B1 | * | 3/2001 | Lin et al. ..................... | 174/260 |
| 6,218,630 B1 | | 4/2001 | Takigami | |
| 6,433,422 B1 | | 8/2002 | Yamasaki | |

* cited by examiner

Primary Examiner—Kamand Cuneo
Assistant Examiner—Jeremy Norris
(74) Attorney, Agent, or Firm—Volentine Francos, PLLC

(57) ABSTRACT

A chip scale package has first and second sets of external signal terminals arranged in rows and columns at respective sides of the bottom surface of the package The spacing between the rows of the first set of signal terminals is greater than the spacing between the rows of the second set of signal terminals. The chip scale packages are mounted to and integrated by a printed circuit board having corresponding lands in each of a plurality of chip scale package regions. Thus, the spacing between adjacent rows of a first set of lands is greater than the spacing between adjacent rows of a second set of lands. The rows of the first lands are spaced wider apart so that a plurality of first signal lines can extend contiguously between each adjacent pair of rows of first lands, in each of the chip scale package regions. A method of designing the printed circuit board lays out the lands of the PCB in rows and columns, sets the spacing thereof, and traces out the signal lines. The signal lines of the printed circuit board are arranged efficiently so that the number of the layers of the printed circuit board necessary for accommodating the lines can be minimized, and the production costs thereof can be kept correspondingly low.

34 Claims, 23 Drawing Sheets

CHIP SCALE PACKAGE, PRINTED CIRCUIT BOARD, AND METHOD OF DESIGNING A PRINTED CIRCUIT BOARD

BACKGROUND OF THE INVENTION

1. Field of the Invention

The present invention relates to a chip scale package, and to a printed circuit board on which chip scale packages are to be mounted so as to become integrated. More particularly, the present invention relates to the design of the layout of external terminals of the chip scale package, and to the corresponding layout of terminals and signal line (wiring) patterns of a printed circuit board.

2. Description of the Related Art

To meet the recent demands for miniaturization and high-speed operation in chip-based technology, chip packages are becoming lighter, thinner, and smaller. Moreover, the features that pose the most limits on the operating speed of the chip are the electrical characteristics of the chip package. In particular, the electrical characteristics of pins for connecting a chip with an external device can greatly affect the operating speed of the chip package. Thus, various kinds of chip packages have been developed around the physical structure and arrangement of their pins.

A chip package that operates at a low speed has a lead frame, and a plurality of pins arranged in a single row at one side of the package. However, such an arrangement poses a limitation on the number of the pins that can be accommodated, the limitation becoming more severe the smaller the package. Moreover, such an arrangement of pins is not suitable for a chip package required to perform a high-speed operation because large amounts of inductance, parasitic capacitance, resistance and the like occur between a bonding pad and the lead frame of the chip package.

To overcome such limitations, a chip scale package (CSP) has been developed in which a plurality of pins (or balls) are arranged along a grid, i.e., two-dimensionally. Such a chip scale package has an advantage in that the electrical parasitic factor of the pins (balls) is less than that of a comparable package comprising a lead frame. Thus, chip scale packages can be made small and yet operate at a high speed.

FIG. 1A is a sectional view of a conventional chip scale package 10 known as a ball grid array (BGA) package. The BGA package 10 includes a semiconductor chip 13 which is electrically connected to I/O pins (solder balls)12. The chip 13 is supported on a printed circuit board (PCB) 11. The PCB 11 also serves to connect the chip 13 to the pins (balls) 12. A detailed description of BGA packages can be found in U.S. Pat. No. 6,041,495, the contents of which are hereby incorporated by reference.

FIG. 1B is a plan view of the pin (ball) layout of the conventional chip scale package 10. Basically, a plurality of the balls 12 are arranged regularly along a grid. When the chip scale package 10 constitutes a memory device, the balls 12 include balls dedicated, respectively, to transmit address and command signals, and to input or output data, and respective balls to be connected to ground and to a power source. In the figure, d1 represents the distance between two adjacent balls 12 along one direction X in the grid, and d2 represents the distance between two adjacent balls 12 along the other direction Y in the grid perpendicular to the first direction X.

A plurality of such chip scale packages are mounted on one surface of a printed circuit board (e.g., a mother board). The pins (balls) are spaced from one another by regular intervals d1, d2, and the pin (ball) lands of the printed circuit board that receive the pins (balls) of the chip scale package are thus also spaced from one another by regular intervals. As discussed in more detail below, only one signal line can be arranged between two adjacent pin (ball) lands. Consequently, all of the required signal lines can not be accommodated on the front surface of a printed circuit board to which the chip scale packages are mounted. Therefore, an additional wiring layer is required for facilitating signal lines, which layer contributes to the high production cost of the board using the chip scale package technology.

FIG. 2 is a plan view of such a printed circuit board on which a plurality of the chip scale packages are mounted. As shown in FIG. 2, eight chip scale packages 10-1 to 10-8 are mounted on the printed circuit board 100. A terminal circuit 14 is arranged to one side (to the left in the figure) of the first chip scale package 10-1. The terminal circuit 14 includes a plurality of pairs of a terminal resistor Rt and a terminal voltage Vt, which are connected in series with each other. The terminal circuit 14 is used to match the impedance of all of the signal lines common to the chip scale packages 10-1 to 10-8. Input/output terminals 16-1 and 16-2 allow signals to be input and output to and from the printed circuit board 100.

However, as was mentioned above, it is very difficult to accommodate all of the signal lines on the front surface of the printed circuit board 100 on which the chip scale packages 10 are mounted. This is because the balls 12 are disposed so close to one another that barely one signal line can pass therebetween. Therefore, most of the signal lines are provided on the other (lower) layers of the printed circuit board 100.

Hereinafter, a configuration of a conventional printed circuit board, having an eight-layered structure, will be described below with reference to FIGS. 3 to 9. These figures are plan views of each of the layers (except for the sixth layer) of the conventional printed circuit board, respectively.

As shown in FIG. 3, the first layer has eight chip scale package regions 10-1 to 10-8 on which the chip scale packages are to be mounted. Ball lands 18 are provided on each of the chip scale package regions 10-1 to 10-8 at locations corresponding to the balls 12 of the chip scale package 10 (see FIG. 1B) to be mounted thereon. A via hole 20 is provided adjacent each ball land 18 for facilitating an electrical connection between the ball lands 18 and signal lines on the lower layers of the printed circuit board. Although not shown, the input and output terminals 16-1 and 16-2 shown in FIG. 2 are connected as well through via holes 20 to signal lines on the lower layers of the printed circuit board.

As shown in FIG. 4, the second layer serves as a ground layer. Via holes 20 in the second layer which are depicted as triangles (for illustration only) serve as ground via holes. In particular, the "triangular" via holes 20 are electrically connected with certain ones of the ball pads 18 on the first layer of the printed circuit board 100. Ground balls of the chip scale package 10 mounted on these ball pads are thus grounded via the triangular via holes 20.

As shown in FIG. 5, the third layer has a plurality of via holes 20 that are electrically connected to the corresponding via holes in the second layer 20, respectively. That is, the via holes 20 shown in FIGS. 3 and 4 are filled with a conductive material so that an electrical connection is provided between the respective layers of the printed circuit board.

Note, the via holes 20 located on one side of the chip scale package regions 10-1 to 10-8 (the upper portion as viewed in the figures) are first via holes dedicated to address and command signal lines, and the via holes 20 located on the other side of the chip scale package regions 10-1 to 10-8 are second via holes dedicated to data lines for inputting and outputting data. Reference numeral 22-1 designates the address and command signal lines connected with respective ones of the first via holes 20. The address and command signal lines 22-1 also pass between adjacent rows of the first via holes 20. The data lines 24-11 to 24-81 are connected to the second via holes 20, respectively. Although not shown, the address and command signal lines 22-1 and the data lines 24-11 to 24-81 are connected with corresponding ones of input and output terminals (e.g., the terminals 16-1 and 16-2 shown in FIG. 2).

All of the address and command signal lines and data lines can not be wired on the third layer of the printed circuit board 100 because each pair of adjacent via holes 20 allows only one line to pass therebetween. That is, only some of the address and command signal lines and only some of the data lines are formed on the third layer.

As shown in FIG. 6, the fourth layer includes via holes 20 that are connected with the via holes 20 of the third layer shown in FIG. 5. The fourth layer is the one at which the chip scale packages are connected to a power source. The "rectangular" via holes 20 serve as power via holes. That is, the rectangular power via holes 20 in the fourth layer are connected with the corresponding via holes in the first to third layers, and are connected to lines emanating from a power source.

As shown in FIG. 7, the fifth layer includes via holes 20 that are connected with the via holes 20 of the fourth layer shown in FIG. 6. Similar to the third layer, the fifth layer includes some of the address and command signal lines 22-2 and some of the data lines 24-12 to 24-82. In other words, some of the wiring which can not be accommodated on the third layer is provided on the fifth layer.

The configuration of the sixth layer of the printed circuit board is the same as that of the second layer shown in FIG. 4. Thus, a separate illustration of the sixth layer is omitted for the sake of brevity, and reference is again made to FIG. 4. In the sixth layer, triangular via holes 20 are electrically connected with corresponding via holes of the first and second layers, the former of which receive the ground balls of the chip scale packages 10-1 to 10-8. Therefore, the chip scale packages 10-1 to 10-8 are grounded only through the ground balls. When designing the printed circuit board on which the chip scale package(s) is/are to be mounted, the ground layer and/or the power layer is/are typically interposed between the layers on which the address and command signal lines and the data lines are provided.

Next, as shown in FIG. 8, the seventh layer includes via holes 20 that are connected with the via holes 20 of the sixth layer shown in FIG. 7. Similar to the fifth layer, the seventh layer includes some of the address and command signal lines 22-3 and some of the data lines 24-13 to 24-83. In other words, the wiring which can not be accommodated on the third and fifth layers is provided on the seventh layer.

Finally, as shown in FIG. 9, the eighth layer includes via holes 20 that are connected with the via holes 20 on the seventh layer shown in FIG. 8.

In the eight-layered structure of the printed circuit board, as shown in FIGS. 3 to 9, each of the address and command signal lines is shared in common by the chip scale package regions 10-1 to 10-8, and, on the other hand, the data lines are not shared in common and instead transmit data to and from only one of the chip scale packages 10-1 to 10-8. In this configuration, even though some of the via holes 20 are not connected to any of the wiring, eight layers are nevertheless required. Further, if it was necessary to wire more or all of the via holes 20 on the chip scale package regions 10-1, than an eight-layer printed circuit board may prove to be insufficient, in which case an additional layer or layers would be required.

In response to the continuing demand for higher operating speeds, chip scale packages are designed with greater numbers of contact balls to facilitate transmission of numerous address and command signals at high input/output speeds. The printed circuit boards on which such a chip scale packages are to be mounted must have a correspondingly large number of signal lines. As such, as the number of contact balls of the chip scale package requiring a connection increases, the number of layers of the conventional circuit board must also increase. The conventional printed circuit board thus requires numerous interlayer wiring layers, leading to high production costs.

SUMMARY OF THE INVENTION

It is thus one object of the present invention to provide chip scale packages that allow the printed circuit board on which the chip scale packages are to be mounted to possess a minimal amount of layers for accommodating all of the external signal lines necessary for the chip scale packages.

In order to achieve this object, one aspect of the present invention provides a chip scale package having first and second sets of external signal terminals (pins/balls) arranged in rows and columns at respective sides of the bottom surface of the package, wherein the spacing between the rows and/or columns of the first set of signal terminals is greater than the spacing between the rows and/or columns of the second set of signal terminals. What is meant by the term "the spacing" is the average distance between adjacent rows and columns, i.e., the average pitch of the spaced apart rows and the average pitch of the space apart columns.

The signal terminals of the first set are of the type that are used to transmit low frequency signals, such as address and command signals, that are intended to travel among a plurality of the chip scale packages via first signal lines of a printed circuit board (PCB) that are shared in common by such packages. On the other hand, the signal terminals of the second set are of the type that are intended to transmit high frequency signals, such as data signals, to/from the chip of only that package. That is, the PCB signal lines to be connected to the second set of terminals are not shared.

The spacing between the rows of the first set of signal terminals is preferably greater than the spacing between the rows of said second set of signal terminals so that a plurality of signal lines can be provided between the rows of the first set of signal terminals when the chip packages are mounted to the PCB. Also, the spacing between the columns of the second set of signal terminals is preferably less than the spacing between the columns of said first set of signal terminals so that a plurality of signal lines can be provided adjacent the set of signal terminals when the chip packages are mounted to the PCB. The design of the chip scale package thus facilitates the provision of more of the signal lines on a layer of the PCB than in the prior art. Thus, fewer additional layers are required to accommodate the remainder of the signal lines.

Likewise, it is another object of the present invention to provide a printed circuit board, on which chip scale packages are to be mounted, having an efficient arrangement of signal lines, whereby the number of layers of the printed circuit board is kept to a minimum.

To achieve this object, another aspect of the present invention provides a printed circuit board comprising a substrate having a plurality of linearly spaced-apart chip scale package regions, a first set of receiving terminals (lands) disposed at one side of each chip scale package region in a plurality of rows and columns, a second set of receiving terminals (lands) disposed at the other side of the chip scale package region also in a plurality of rows and columns, wherein the spacing between the rows of the first set of terminals is greater than the spacing between the rows of the second set of terminals, a first set of signal lines a plurality of which extend contiguously between each adjacent pair of rows of the first set of terminals in each of the chip scale package regions, and second signal lines connected to the receiving terminals of the second set in each chip scale package region.

The first signal lines are dedicated as address and command signal lines. Each of the signal lines of the first set is connected to a respective terminal constituting the adjacent pair of rows in each of the chip scale package regions. The number of first signal lines extending between each pair of adjacent rows of first set of receiving terminals, in each chip scale package region, is preferably equal to half the number of columns of the first set of receiving terminals in the chip scale package region.

The second signal lines are dedicated as data lines. Each of the second signal lines is connected to only one receiving terminal of the second set, in each chip scale package region.

Half of all of the required signal lines can be provided on the layer of the of the PCB at which the chip scale package regions are defined, and are preferably provided on the upper outer surface of the substrate of the PCB. The remainder of the signal lines can be provided all on another layer, such as on the lower outer surface, or layers.

Another object of the present invention is to provide an electronics module that is economical to produce. This object is achieved by the combination of the above-described printed circuit board and chip scale packages mounted thereto.

It is still another object of the present invention to provide a method of designing a printed circuit board of a module in which chip scale packages are integrated, which will minimize the number of layers to be produced for accommodating the signal lines used to integrate the chip scale packages.

To achieve this object, another aspect of the present invention provides a method of designing a printed circuit board. The method includes creating a chip scale package region layout to scale for one of the layers of the printed circuit board, determining the total number n of the first signal lines through which signals need to be transmitted along the printed circuit board among chip scale packages mounted over the chip scale package regions, respectively, and creating a receiving terminal layout of a plurality of first terminal locations (lands) in each chip scale package region by factoring the number n of required first signal lines into factors of c and r, arranging the first terminal locations in a number of rows equal to r in each chip scale package region, and in a number of columns equal to c in each chip scale package region, and spacing the rows from each other by intervals sufficient to allow at least c/2 of the first signal lines to be printed on the circuit board between adjacent rows of the terminals formed on the printed circuit board according to the receiving terminal layout.

A first signal line layout to scale is also created, representing locations at which the first signal lines are to be formed on the layer of the PCB at which the chip scale package regions are defined. The first signal line layout is created by laying out between each pair of adjacent rows of the first terminal locations, in each chip scale package region location, (at least) n/2 first signal line traces passing from one chip scale region location to the other and each of which traces is connected in each of the chip scale package regions with a respective one of the first terminal locations comprising the adjacent rows thereof.

A receiving terminal layout and a signal line layout are also created for the second signal lines.

A via hole layout is then created, representing the locations of via holes to be connected to respective ones of the first and second receiving terminals that are not designated for connection to a signal line on the layer of the PCB at which the chip scale package regions are defined.

An additional set(s) of signal line layouts is created for another layer(s) of the PCB. The via holes represented by the via hole layout will extend to this/these layer/layers for connection to the signal lines represented by the additional set(s) of signal line layouts.

As described hereinabove, according to the present invention, the number of common signal lines on a layer(s) of the printed circuit board is increased so that the total number of layers of the printed circuit board required to accommodate all of the signal lines can be decreased. Thus, the production cost of the PCB can be kept low.

BRIEF DESCRIPTION OF THE DRAWINGS

These and other objects, features and advantages of the present invention will become more apparent from the following detailed description of the preferred embodiments thereof made with reference to the accompanying drawings, in which like reference numerals denote like parts, and in which.

DETAILED DESCRIPTION OF PREFERRED EMBODIMENTS

The preferred embodiments of the present invention will now be described in detail with reference to the accompanying drawings.

Figure 1A:
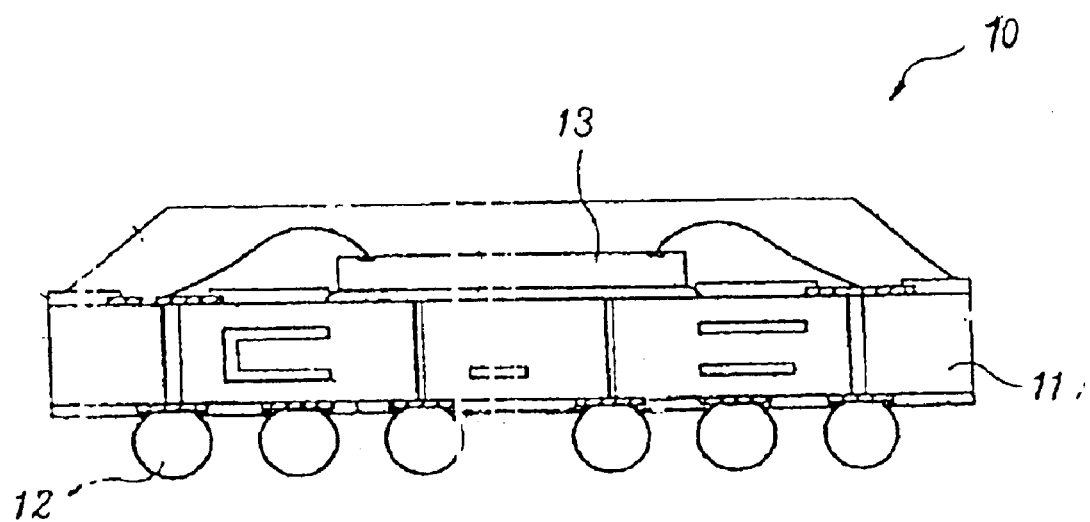
FIG. 1A is a sectional view of a conventional chip scale package.
Figure 1B:
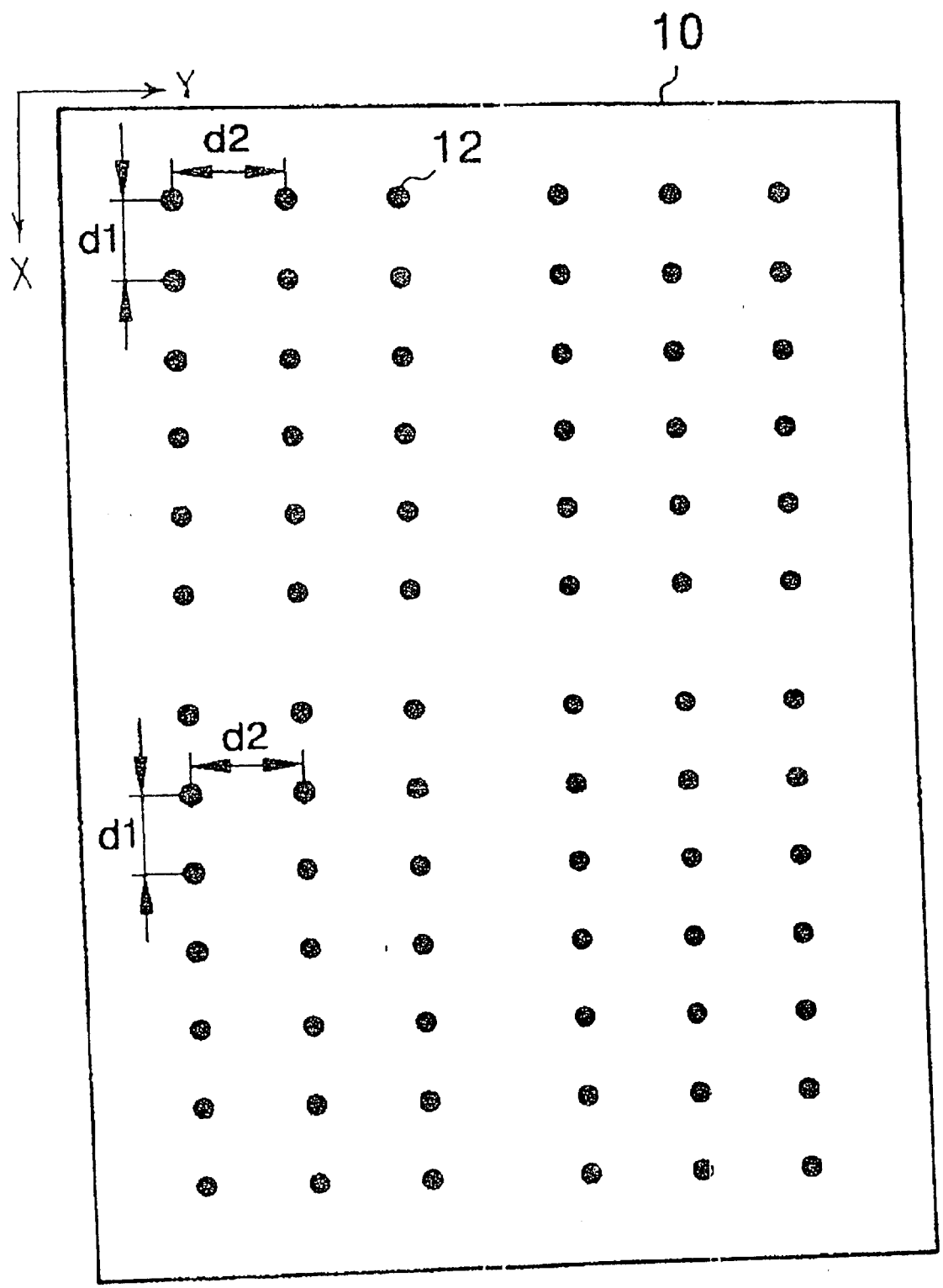
FIG. 1B is a plan view of a layout of pins (balls) of a conventional chip scale package.
Figure 2:
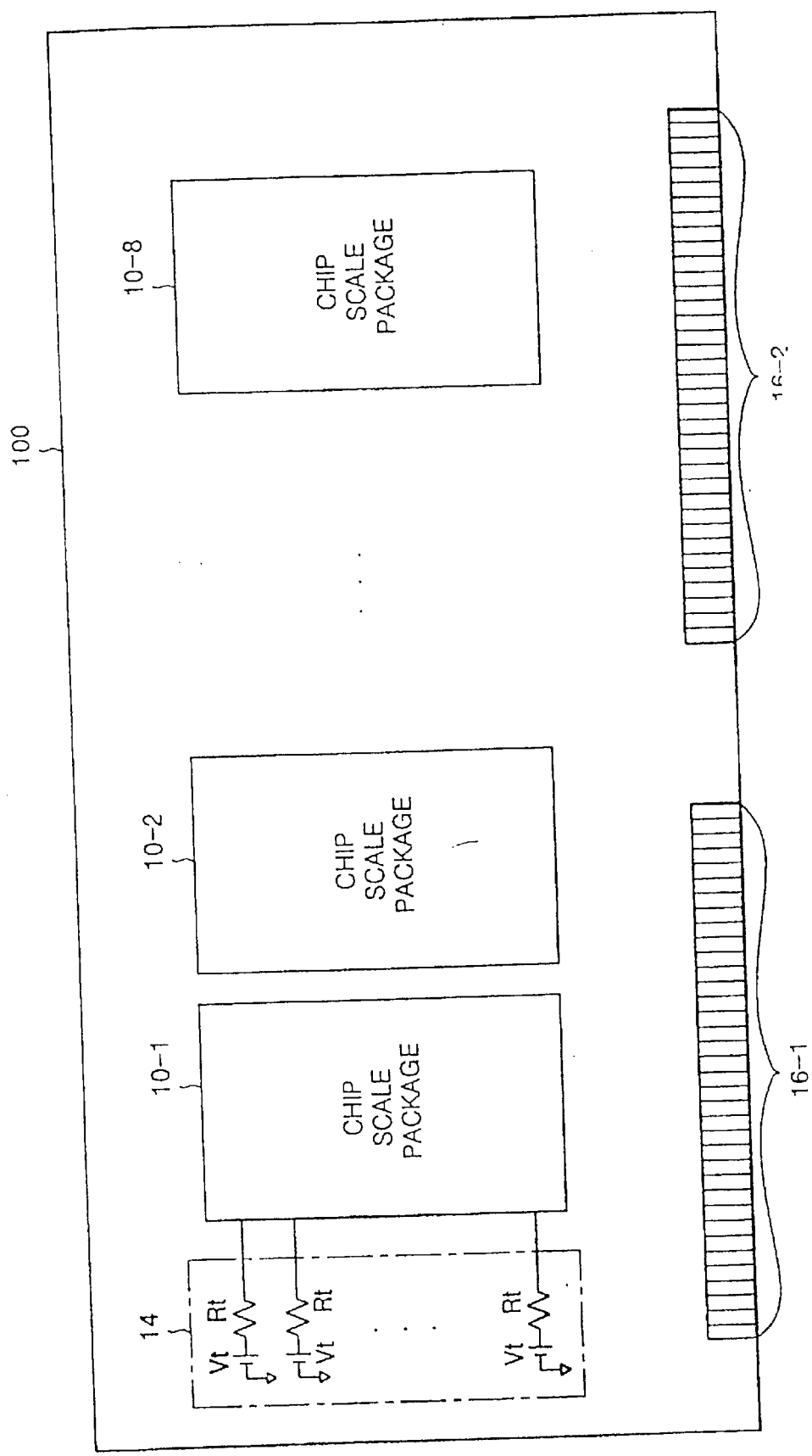
FIG. 2 is a plan view of a conventional printed circuit board.
Figure 3:
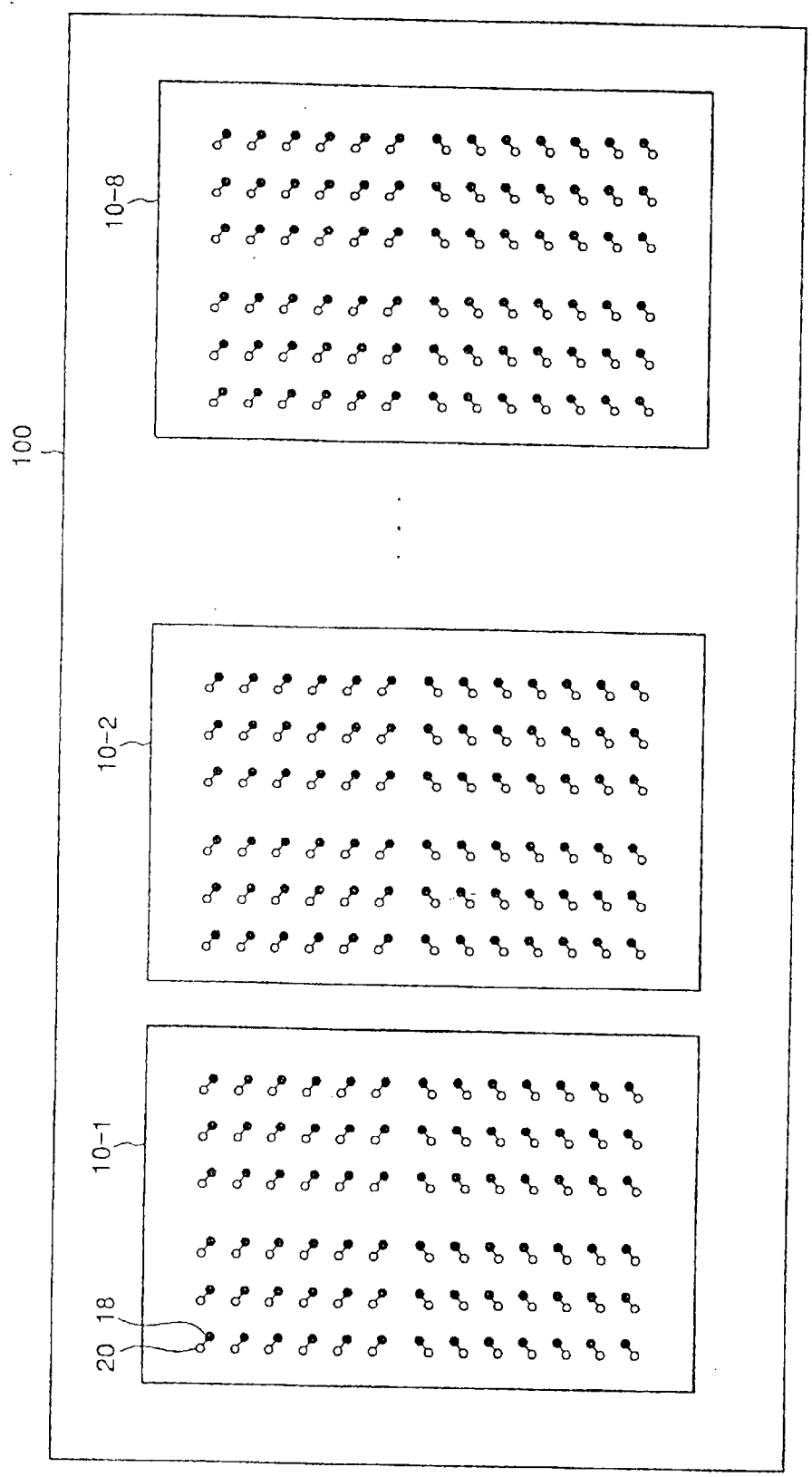
FIG. 3 is plan view of a first layer of the conventional printed circuit board.
Figure 4:
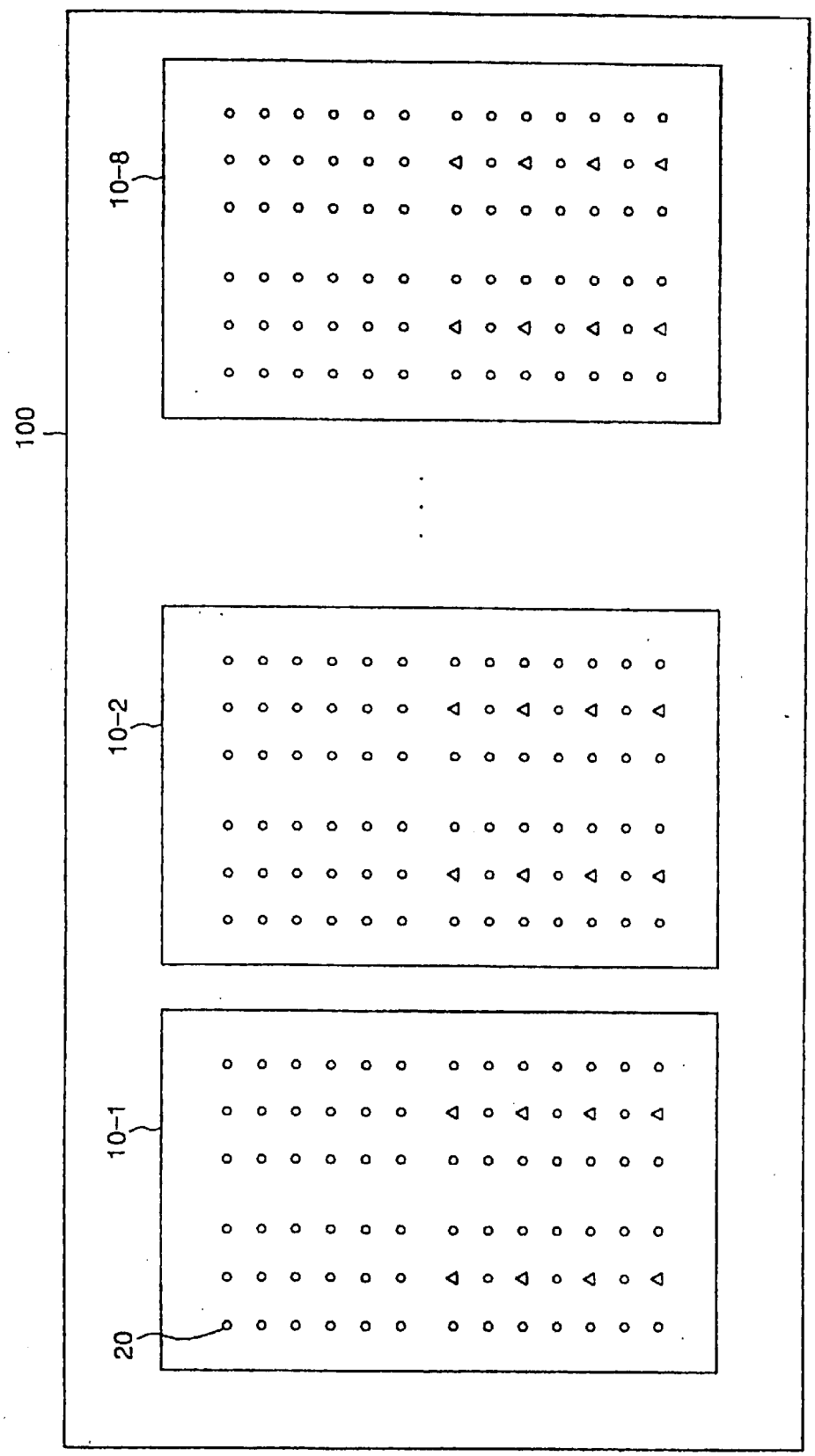
FIG. 4 is a plan view of a second layer of the conventional printed circuit board.
Figure 5:
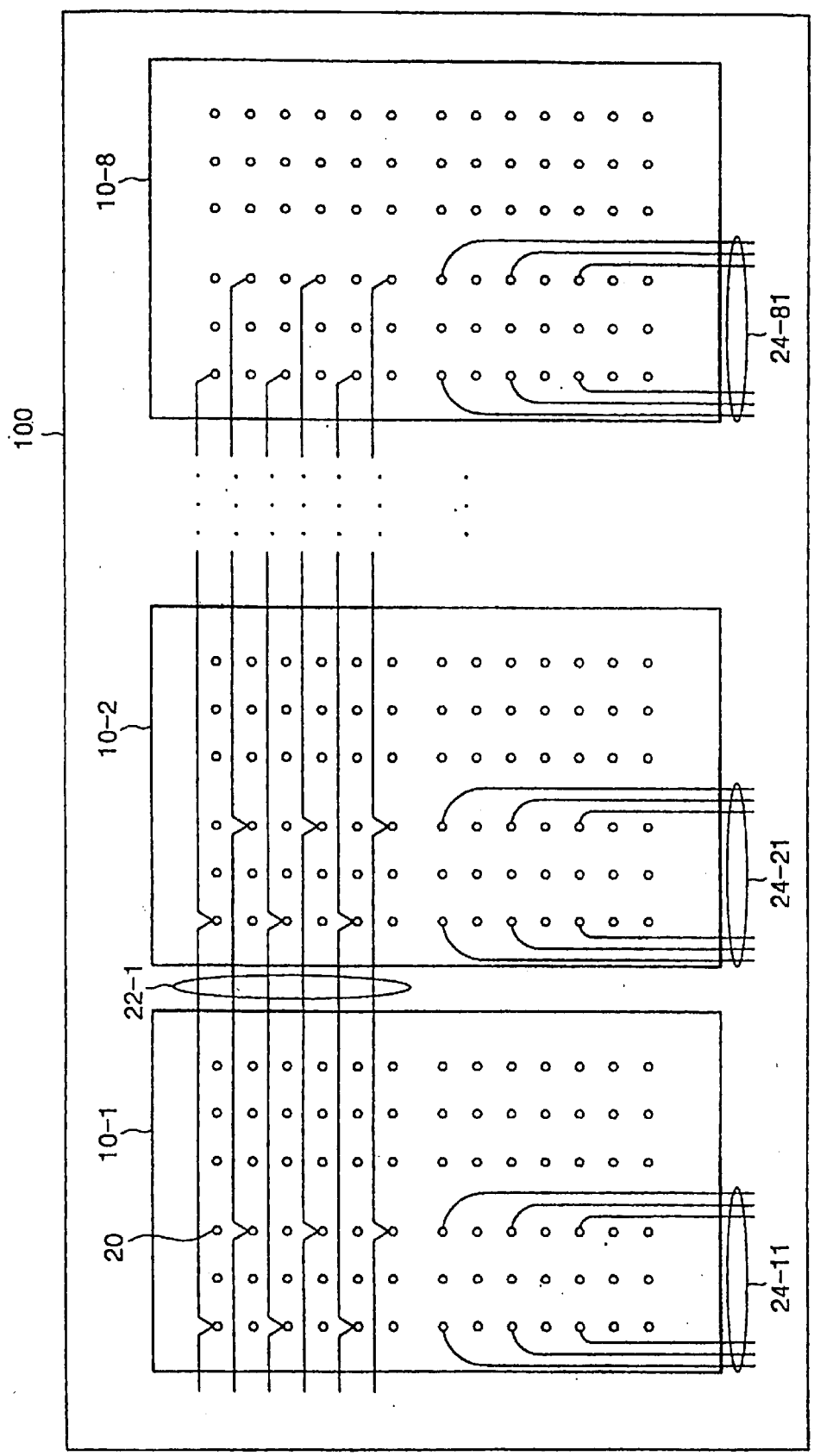
FIG. 5 is a plan view of a third layer of the conventional printed circuit board.
Figure 6:
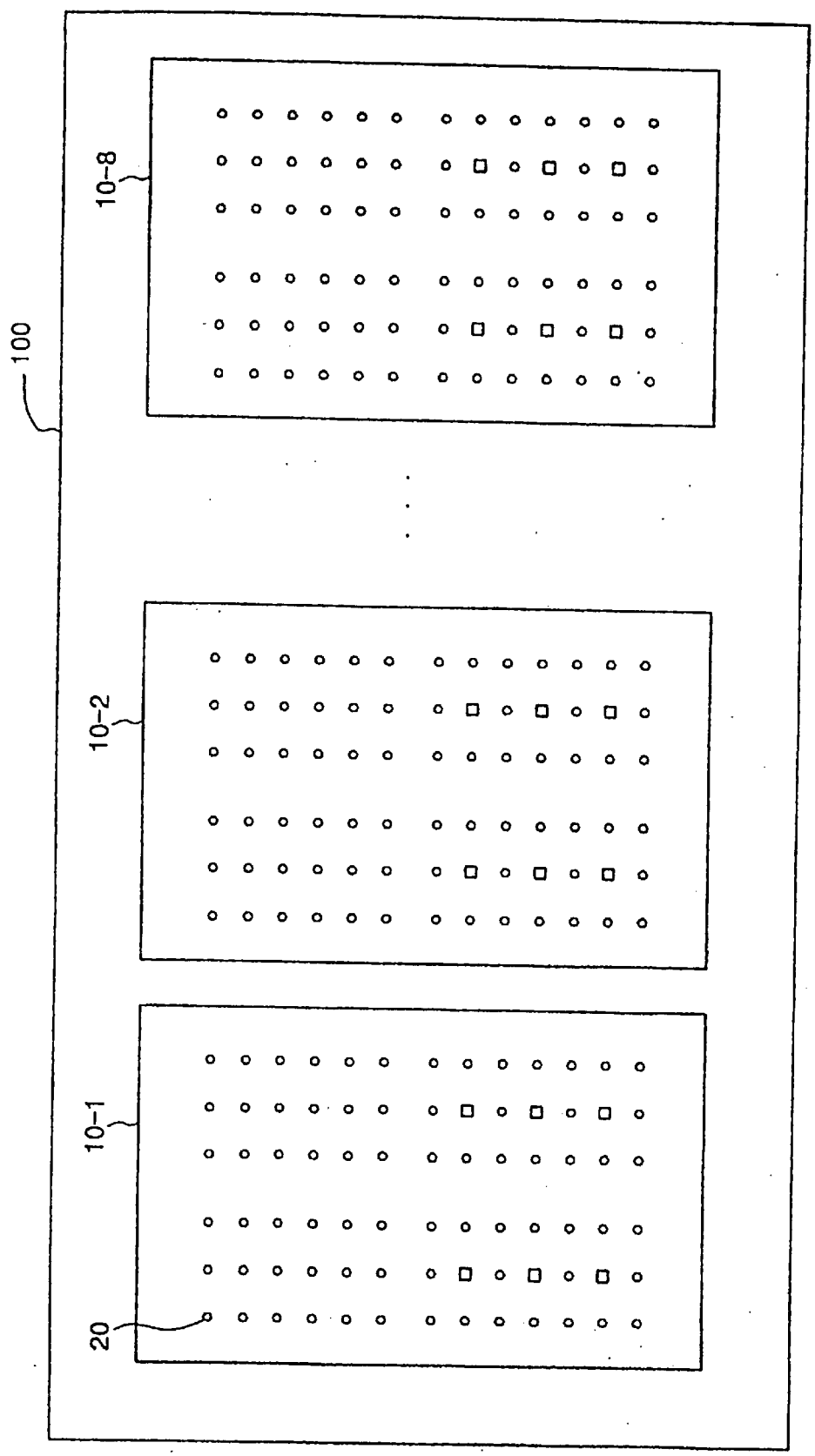
FIG. 6 is a plan view of a fourth (and sixth) layer of the conventional printed circuit board.
Figure 7:
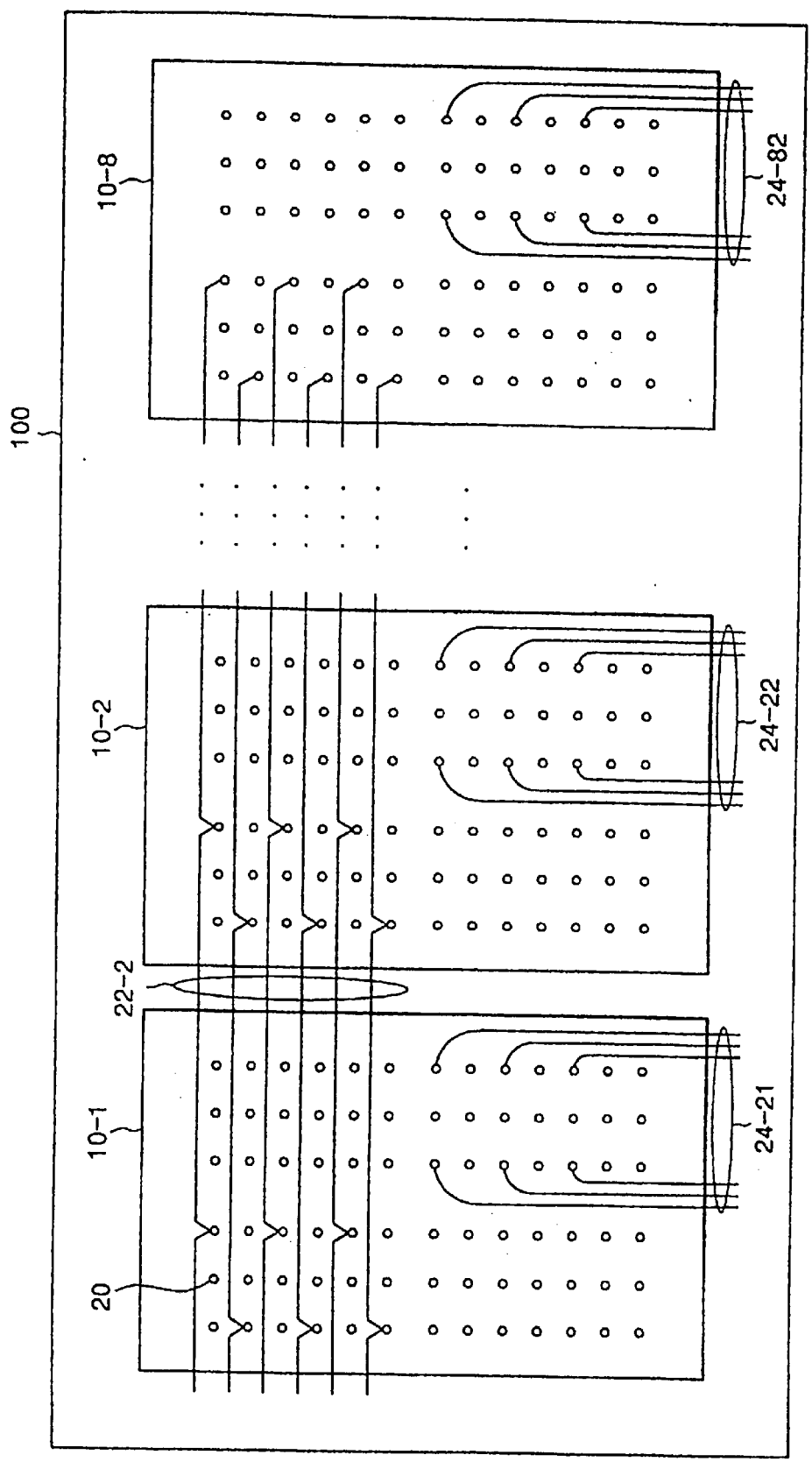
FIG. 7 is a plan view of a fifth layer of the conventional printed circuit board.
Figure 8:
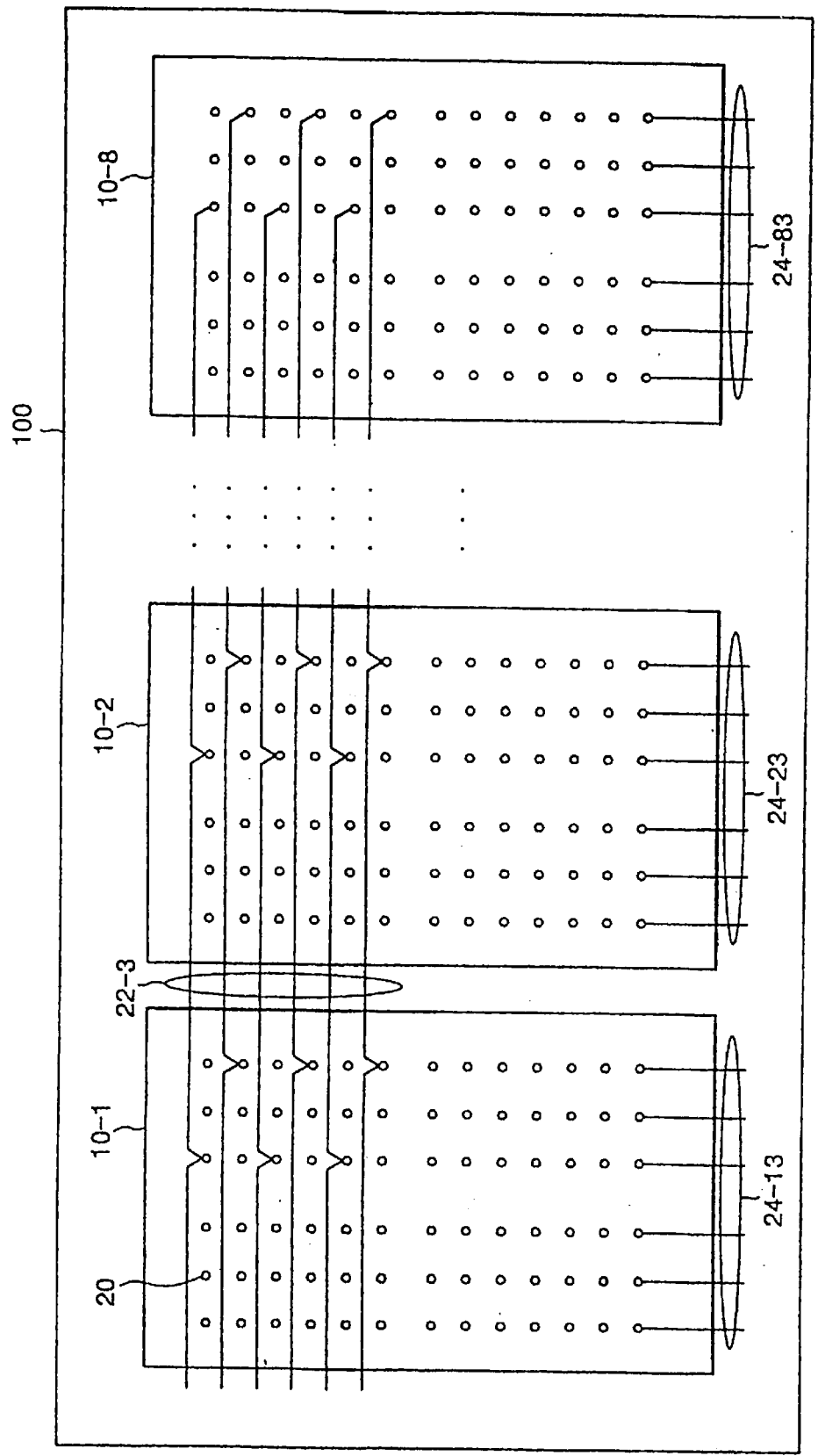
FIG. 8 is a plan view of a seventh layer of the conventional printed circuit board.
Figure 9:
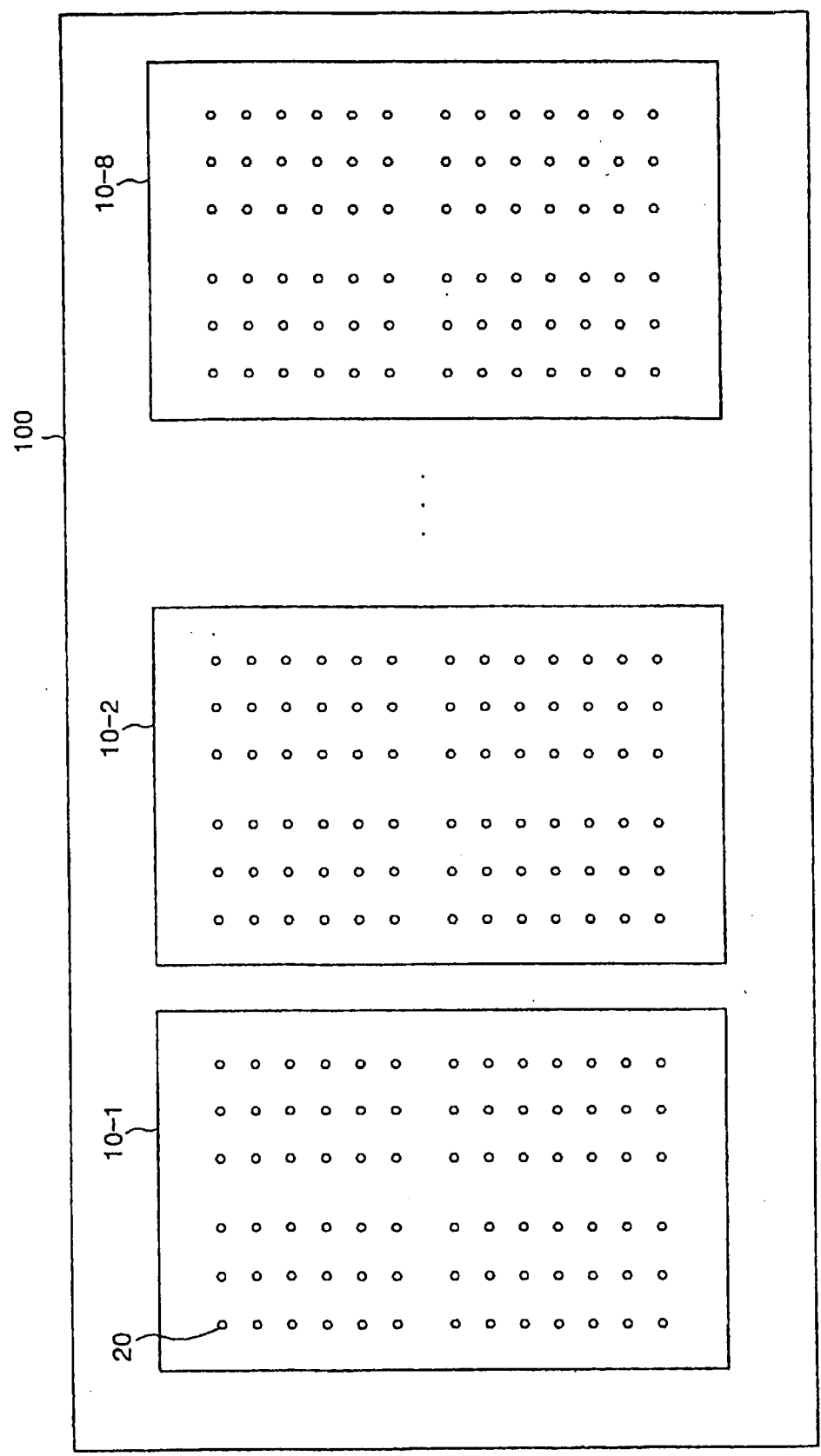
FIG. 9 is a plan view of an eighth layer of the conventional printed circuit board.

The chip scale packages of the present invention may have essentially the same general structure (chip, package body, external terminals) as that described in U.S. Pat. No. 6,041,495 and therefore, reference is again made to FIG. 1A. Accordingly, a detailed description thereof will be omitted for the sake of brevity.

Figure 10:
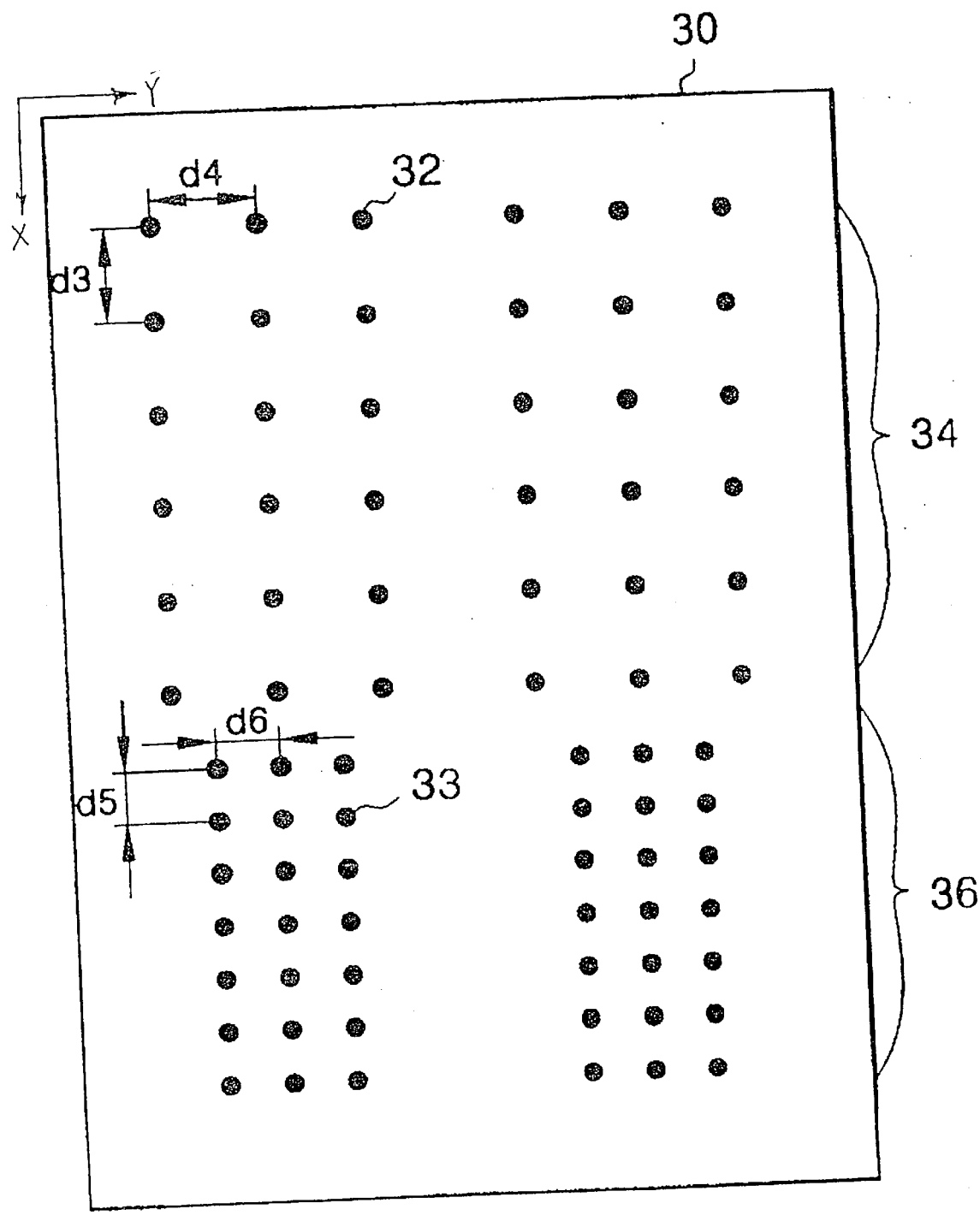
FIG. 10 is a plan view of a layout of pins (balls) of a first preferred embodiment of a chip scale package according to the present invention.

However, FIG. 10 illustrates the terminal layout of a first preferred embodiment of a chip scale package according to the present invention. As shown in FIG. 10, the chip scale package 30 includes a plurality of a first set of balls 32 and a second set of balls 33 projecting at the bottom surface of the package body. The first set is spaced from the second set in a first direction X.

More specifically, the first balls 32 are disposed on one side 34 of the chip scale package 30 and are spaced from one another in two orthogonal directions X and Y. Here, the X direction may be considered the column direction, and the Y direction may be considered the row direction. Reference numeral d3 designates the distance between the rows of the first balls 32 in the direction X, and reference numeral d4 designates the distance between the columns of the first balls 32 in the other direction Y. The first balls 32 are for the transmission of address and command signals.

The second balls 33 are disposed on the other side 36 of the chip scale package 30 and are also spaced from one another in the same two orthogonal directions X and Y. Reference numeral d5 designates the distance between the rows of second balls 33 in the direction X, and reference numeral d6 designates the distance between the columns of the second balls 33 in the other direction Y. The second balls 33 are for the inputting/outputting of data signals.

The spacing of the first balls 32 from one another is greater than the average spacing of the second balls 33. In this embodiment, the average spacing in both the first and the second directions X and Y is greater for the first balls 32 than the second balls 33. In FIG. 10, the distance d3 between adjacent rows of the first balls 32 is greater than the distance d5 between adjacent rows of the second balls 33, and the distance d4 between adjacent columns of the first balls 32 is greater than the distance d6 between adjacent columns of the second balls 33.

Figure 11:
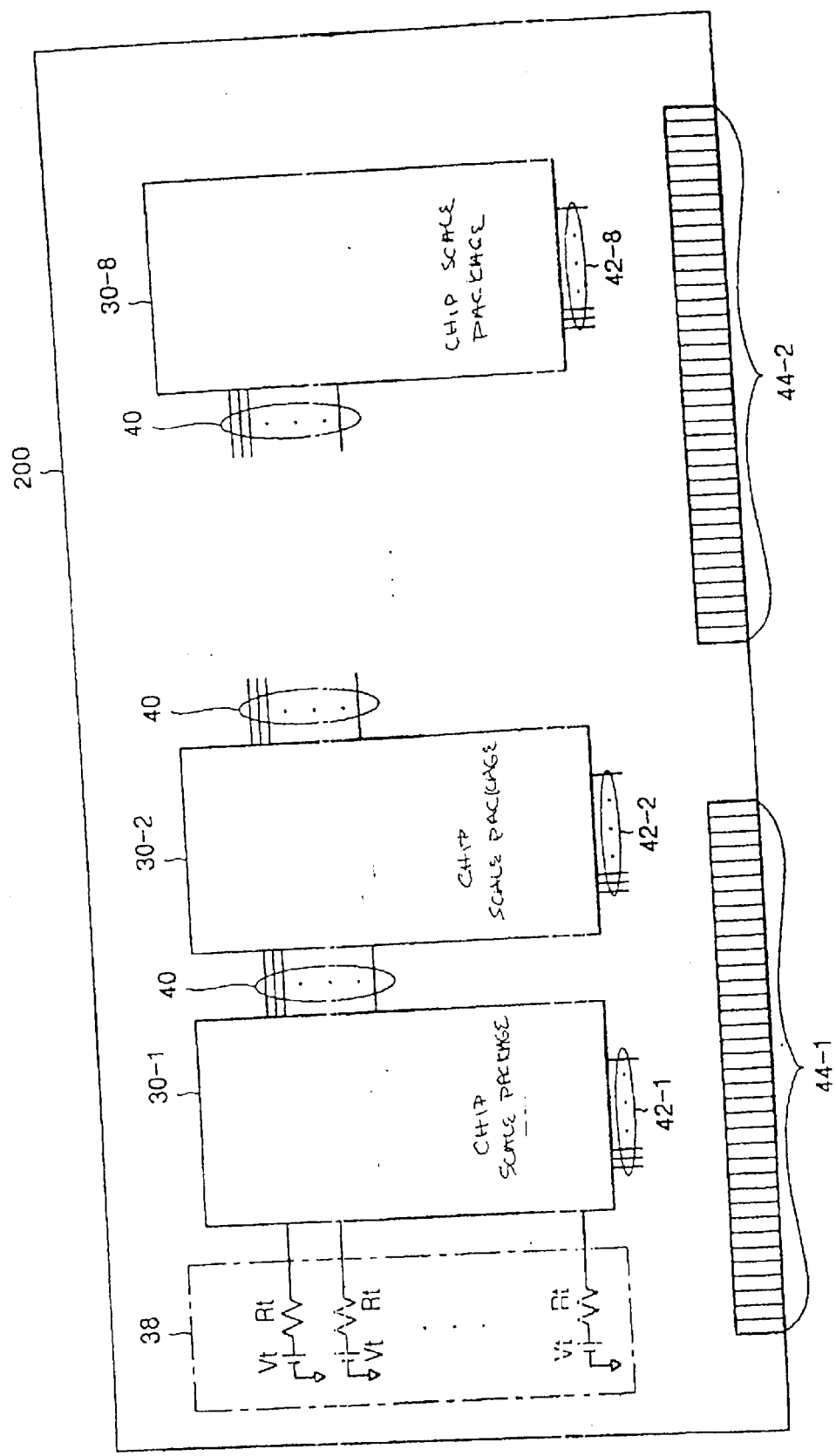
FIG. 11 is a plan view of a first embodiment of a module comprising a first embodiment of a printed circuit board according to the present invention, and chip scale packages of the type shown in FIG. 10.

FIG. 11 illustrates a printed circuit board on which the chip scale packages 30 are mounted to form a module. As shown in FIG. 11, eight chip scale packages 30-1 to 30-8 are mounted on the printed circuit board 200. A terminal circuit 38 is provided to one side (to the left in the figure) of the first chip scale package 30-1. The terminal circuit 38 includes a plurality of pairs of a terminal resistor Rt and a terminal voltage Vt, which are connected in series with each other. The terminal circuit 38 is used to match the impedance of signal lines of the scale chip packages 30-1 to 30-8. Signal input and output terminals 44-1 and 44-2 are provided at one side of the printed circuit board 200 and are spaced apart from each other.

Signal lines including address and command signal lines 40 and data lines 42-1 to 42-8 are printed on the upper outer (front) surface of the printed circuit board 200. However, the address and command signal lines 40 and the data lines 42-1 to 42-8 may be printed on the bottom surface of the printed circuit board 200. The data lines 42-1 to 42-8 are not shared in common among the chip scale packages 30-1 to 30-8 mounted on the printed circuit board 200. Rather, each set of data lines 42-1 to 42-8 is connected to a respective one of the chip scale packages 30-1 to 30-8. On the other hand, the chip scale packages 30-1 to 30-8 do share the address and command signal lines 40. The signal input and output terminals 44-1 and 44-2 are connected to the address and command signal lines 40 and the data lines 42-1 to 42-8.

The printed circuit board 200 has a four-layered structure. FIGS. 12 to 15 illustrate the configurations of each of the layers of the printed circuit board 200, respectively.

Figure 12:
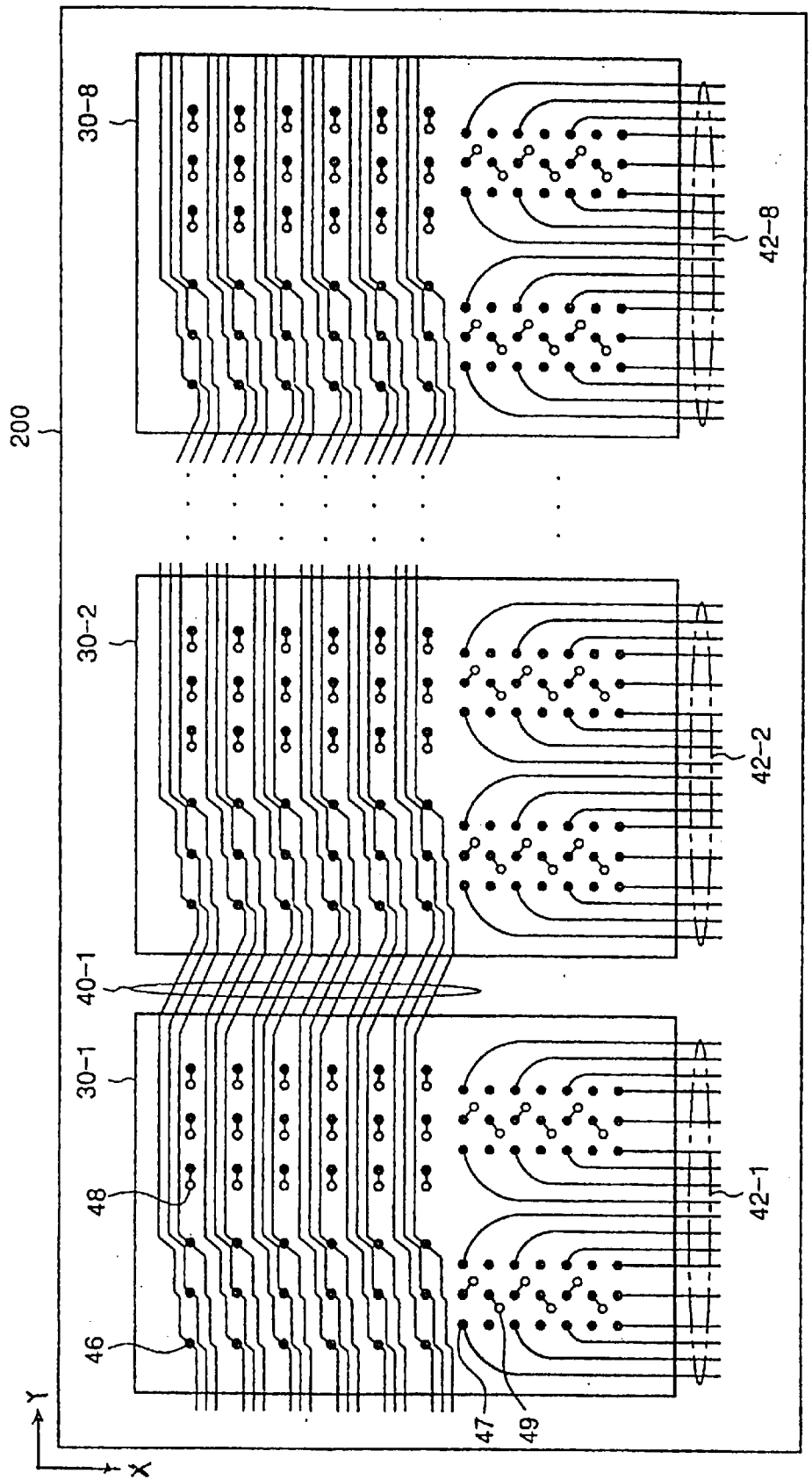
FIG. 12 is a plan view of a first layer of the first preferred embodiment of a printed circuit board according to the present invention.

As shown in FIG. 12, the first layer includes eight linearly spaced apart chip scale package regions 30-1 to 30-8 on which the chip scale packages are mounted. Each of the chip scale package regions 30-1 to 30-8 includes first and second sets of lands 46 and 47. Each of the first and second sets of lands 46 and 47 are arranged in a plurality of rows and columns, corresponding to the arrangements of the balls of the chip scale packages, and are connected with the first and second sets of balls 32 and 33 of the chip scale packages, respectively. Thus, a respective first set of lands 46 is provided at one side of each chip scale package region, and a respective second set of lands 47 is provided at the other side of each chip scale package region. The first set of lands 46 is spaced from the second set of lands 47 in a direction X, which is perpendicular to the direction Y in which the chip scale package regions 30-1 to 30-8 are spaced.

First and second sets of via holes 48 and 49 in the first layer provide an electrical connection between the first and second lands 46 and 47 and wiring patterns on the lower layers of the printed circuit board. As mentioned above, the address and command signal lines 40-1 are shared. More specifically, each address and command signal line is connected to a respective first land 46 provided at each of the chip scale package regions 30-1 to 30-8. The first lands 46, which are not connected with the address and command signal lines 40-1, are connected with the first via holes 48, respectively.

Moreover, the spacing between adjacent rows of the first set of lands 46 is greater than the spacing between adjacent rows of the second set of lands 47. The relatively large spacing between the first lands 46 allows three signal lines 40-1 to extend between adjacent rows of the first lands 46.

The data lines 42-1 are not shared among the chip scale packages and hence, are not shared by second lands 47 of the chip scale package regions 30-1 to 30-8. That is, the data lines 42-1 to 42-8 of each set thereof are connected to the second lands 47, respectively, provided at a respective chip scale package region. The data lines 42-1 to 42-8 serve to input or output data through the input and output terminals 44-1 and 44-2.

Also, in FIG. 12, the first and second ball lands 46 and 47 which are not shown as connected to either the first and second via holes 48 and 49 or the signal lines, have no electrical connection whatsoever.

Figure 13:
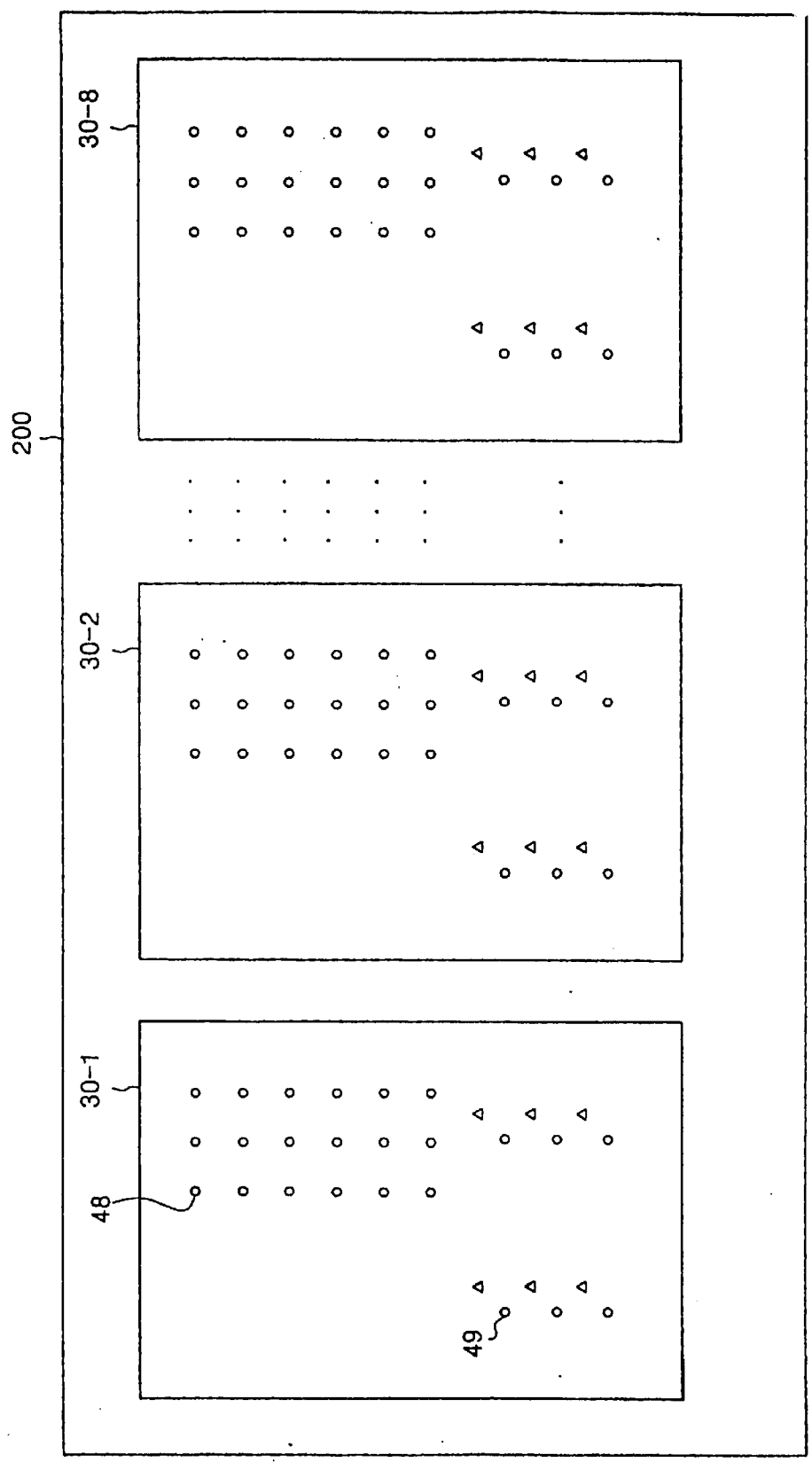
FIG. 13 is a plan view of a second layer of the first preferred embodiment of the printed circuit board according to the present invention.

As shown in FIG. 13, the second layer of the printed circuit board 200 includes first and second via holes 48 and 49 that are connected with the first and second via holes 48 and 49 in the first layer shown in FIG. 12. The second layer is used as a ground layer. Of the second via holes 49, the "triangular" via holes 49 serve as grounds. In particular, the triangular via holes 49 are connected with ground balls of the chip scale packages, and none of the other balls of the chip scale packages are electrically connected with the second layer. Therefore, only the ground balls of the chip scale packages are grounded.

Figure 14:
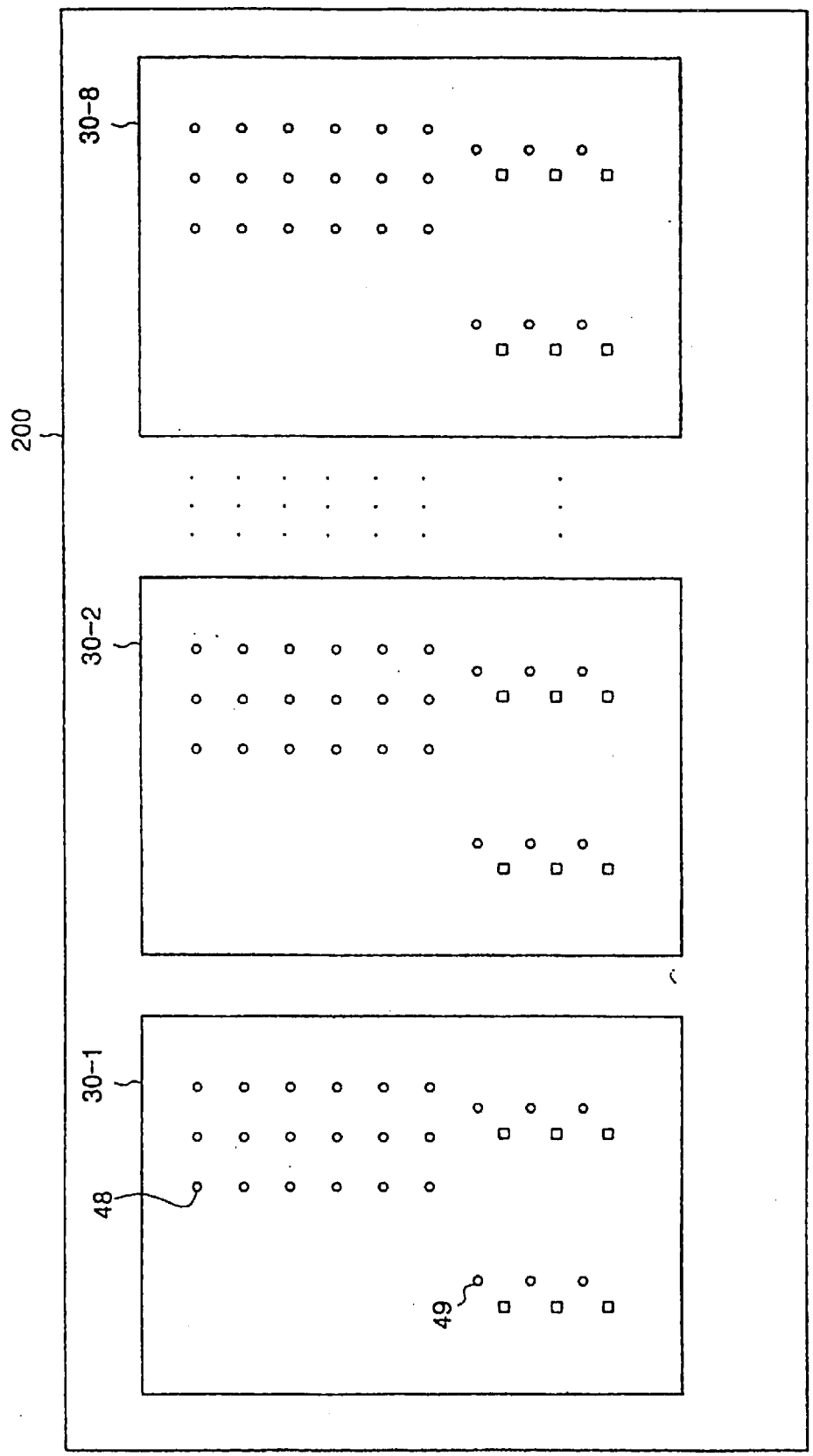
FIG. 14 is a plan view of a third layer of the first preferred embodiment of the printed circuit board according to the present invention.

Next, as shown in FIG. 14, the third layer includes first and second via holes 48 and 49 that are connected with the first and second via holes 48 and 49 in the second layer shown in FIG. 13. Of the second via holes 49, the "rectangular" via holes 49 are connected with the power balls of the chip scale packages. The other balls of the chip scale packages are not electrically connected with the third layer. Therefore, power is supplied to only the power balls of the chip scale packages through the rectangular via holes.

Figure 15:
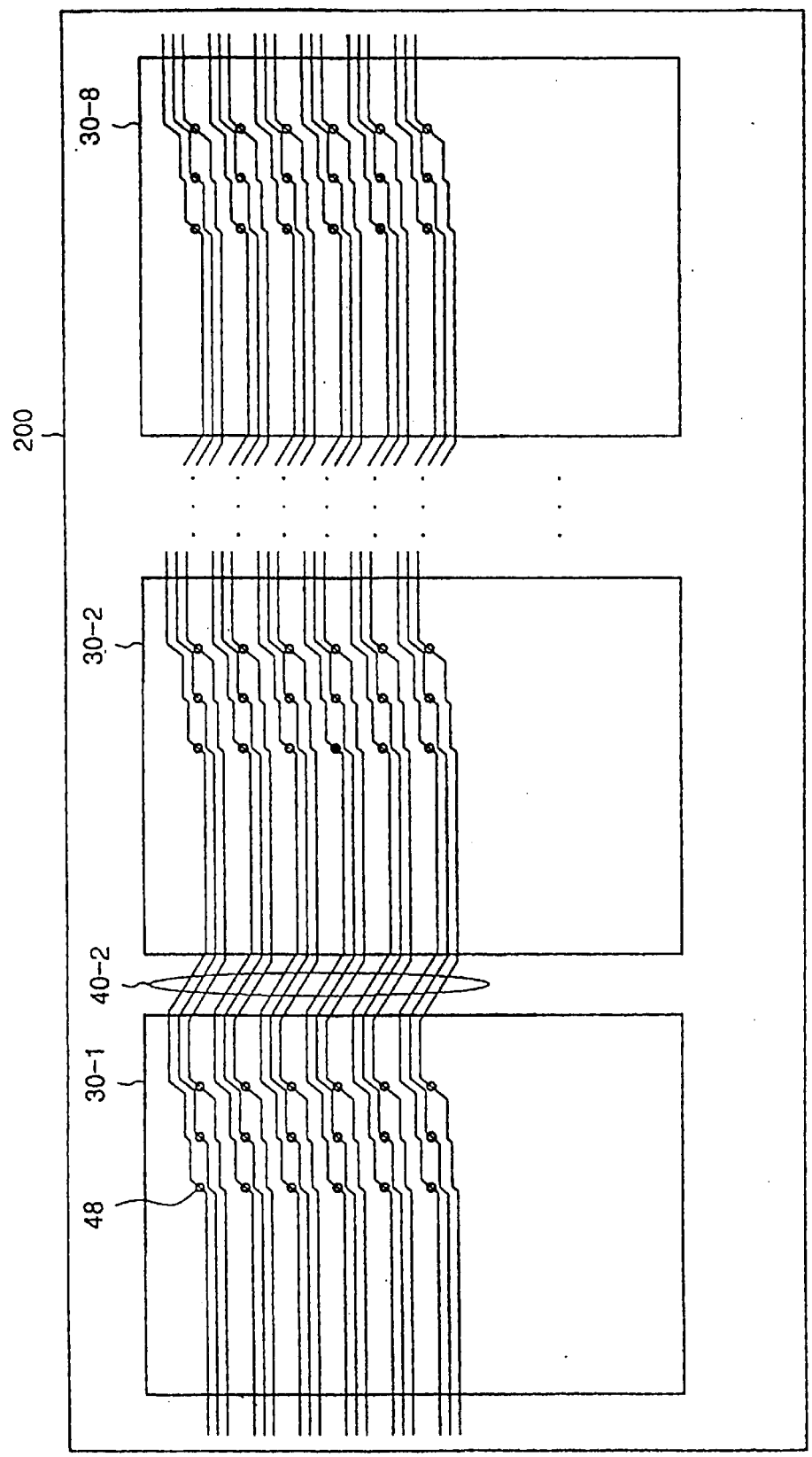
FIG. 15 is a plan view of a fourth layer of the first preferred embodiment of the printed circuit board according to the present invention.

As shown in FIG. 15, the fourth layer includes first and second via holes 48 and 49 that are connected with the first and second via holes 48 and 49 in the third layer shown in FIG. 14. Three address and command signal lines 40-2 extend between adjacent rows of the first via holes 48 and are connected with the first via holes 48 that are not connected with the first lands 46 on the first layer shown in FIG. 12.

As can be seen from a comparison of FIGS. 12-15 with FIGS. 2-9, the present embodiment of the printed circuit board differs from that conventional printed circuit board in several respects. First, the rows of the first terminals for command and control signals are spaced apart at a greater distance to allow for a plurality of signal lines to extend between the terminals from one chip scale package region to the next. Second, the columns of the terminals for the data signals are spaced closer together to allow for additional dedicated data lines to be placed adjacent to or between sets of terminals in each chip scale package region. The result is the four-layer printed circuit of the present embodiment, compared to the eight-layer printed circuit board of the conventional configuration.

Figure 16:
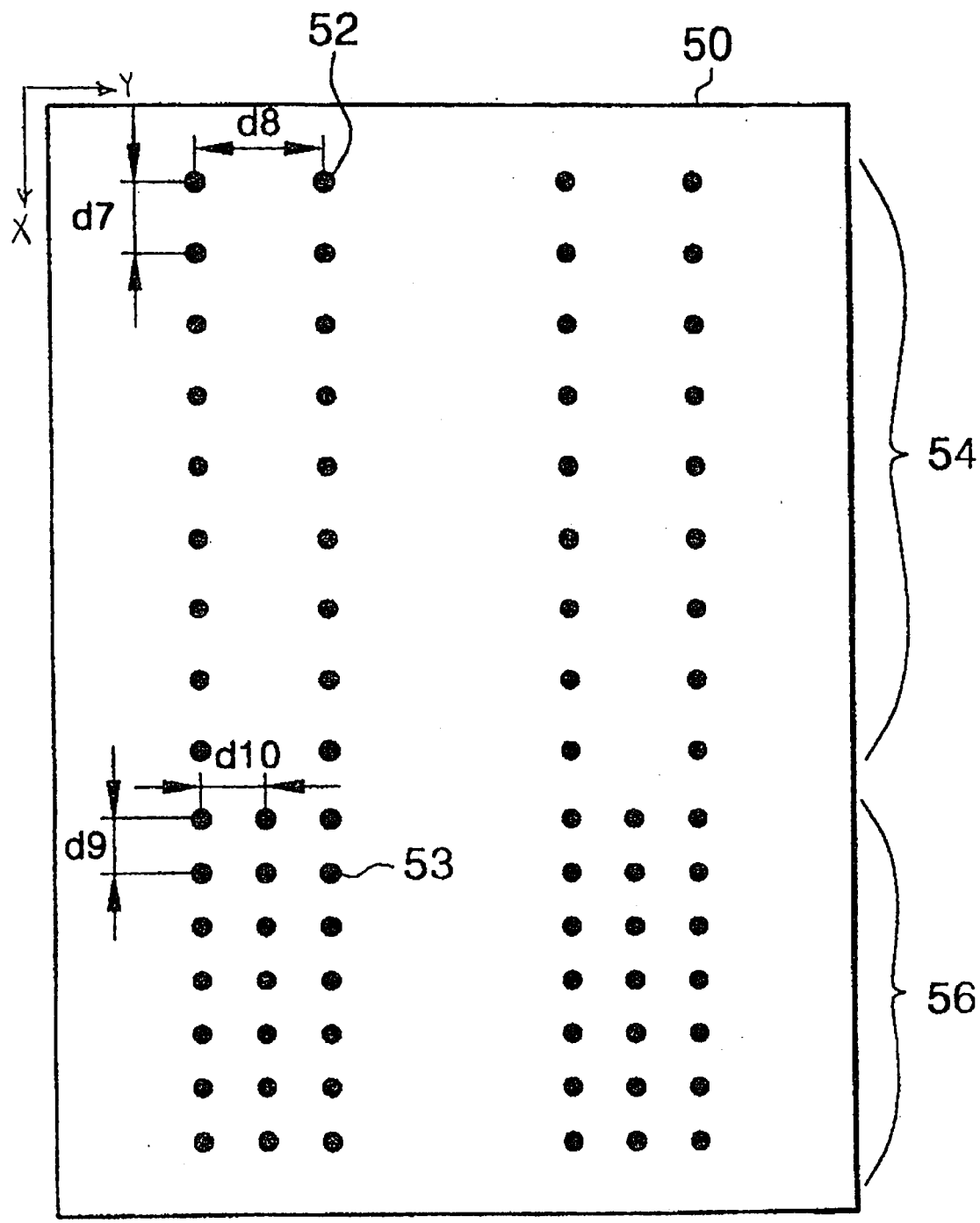
FIG. 16 is a plan view of a second preferred embodiment of a chip scale package according to the present invention.

FIG. 16 illustrates the layout of pins (balls) of a second preferred embodiment of a chip scale package according to the present invention. As shown in FIG. 16, the chip scale package 50 includes a plurality of first and second sets of balls 52 and 53.

The first balls 52 are arranged in four columns at side 54 of the chip scale package 50. Reference numeral d7 designates the distance between the first balls 52 in one X of two orthogonal directions X and Y, and d8 the distance between the balls 52 in the other direction Y. The first balls 52 are for the transmission of address and command signals.

The second balls 53 are arranged in six columns at the other side 56 of the chip scale package 50. The distance between the second balls 53 in direction X is designated by reference numeral d9, and the distance between the second balls 53 in the other direction Y is designated by reference numeral d10. The balls 53 are for the inputting/outputting of data signals. The spacing of the first balls 52 is greater than that of the second balls 53. In this embodiment, the distances d7, d8 between the first balls 52 are greater than the distances d9, d10 between the second balls 53 in directions X and Y, respectively.

Figure 17:
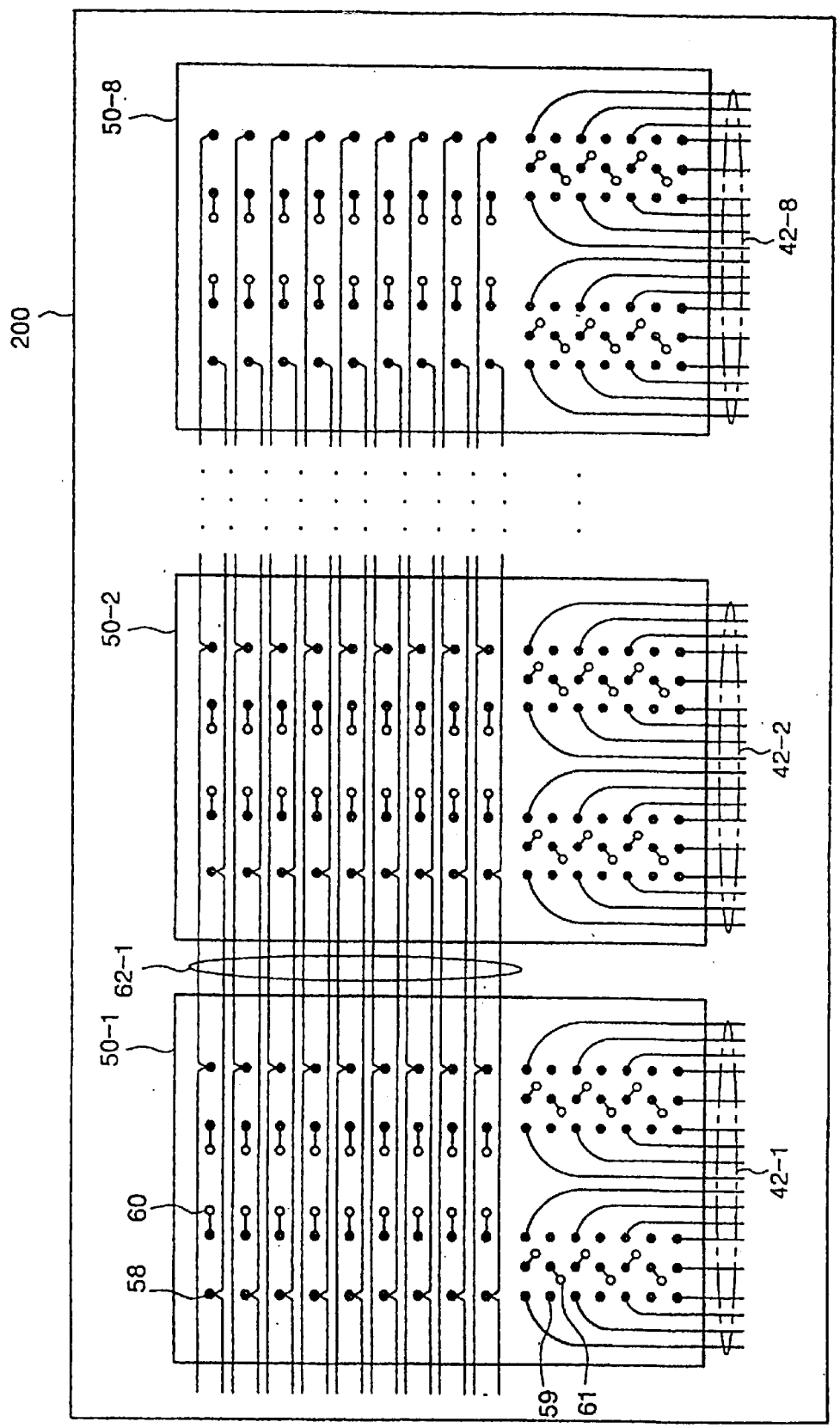
FIG. 17 is a plan view of a first layer of the second preferred embodiment of the printed circuit board according to the present invention.
Figure 18:
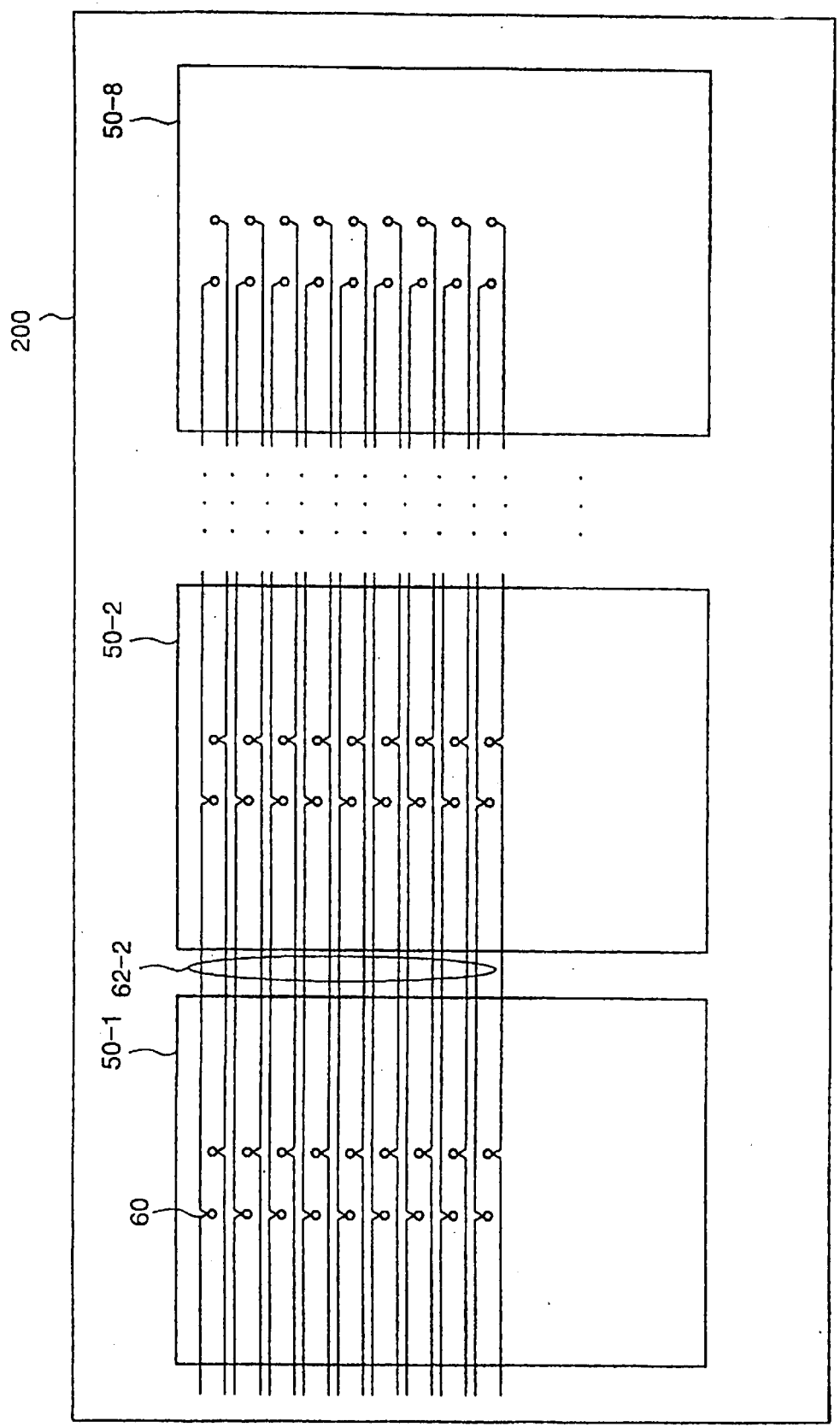
FIG. 18 is a plan view of a fourth layer of the second preferred embodiment of the printed circuit board according to the present invention.

The printed circuit board to which the chip scale package 50 is mounted has four layers. FIGS. 17 to 18 illustrate the patterns of the first and fourth layers of the printed circuit board. The second and third layers of the printed circuit board have similar patterns to those shown in FIGS. 13 and 14.

Referring now to FIG. 17, the first layer includes eight chip scale package regions 50-1 to 50-8 on which the chip scale packages are mounted. Each of the chip scale packages 50-1 to 50-8 includes first and second sets of lands 58 and 59 in the same pattern as that of the first and second sets of balls 52 and 53 of a chip scale package, and first and second sets of via holes 60 and 61. The first lands 58 in the first and fourth columns are connected with the address and command signal lines 62-1. The relatively great spacing between the adjacent rows of first lands 58 allows at least two of the address and command signal lines 62-1 to extend between the adjacent rows.

The second lands 59 are connected with the data lines 42-1 to 42-8 in the same manner as described in connection with the first embodiment and shown in FIG. 10.

As shown in FIG. 18, the first lands 58 in the second and third columns are connected with the address and command signal lines 62-2 through the first via holes 60. Thus, at least two address and command signal lines 62-2 extend between adjacent rows of the first via holes 60 in the fourth layer.

Figure 22:
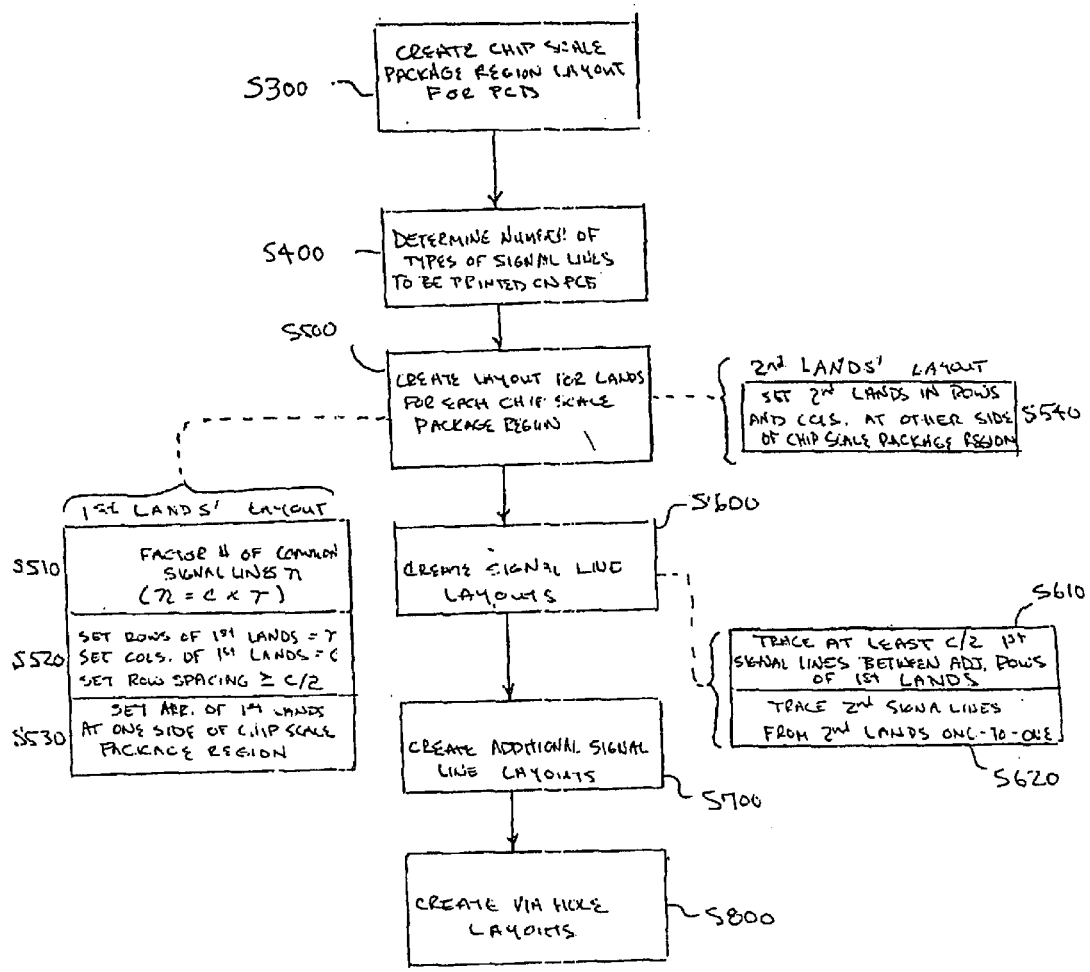
FIG. 22 is a flow chart of a method of designing printed circuit boards according to the present invention.

Next, reference will be made to FIG. 22 which is a flow chart of a method by which printed circuit boards, including those of FIGS. 12 and 17, can be designed.

In a first step S300, a chip scale package layout is created to scale for one of the layers of the printed circuit board, e.g. the upper layer constituted by the upper outer surface of the PCB. The chip scale package region layout is a representation of the regions of the printed circuit board directly over which the chip scale packages are to be mounted. Thus, the chip scale package region layout comprises linearly spaced apart chip scale package region locations corresponding in size and number to the chip scale packages that are to be mounted to and integrated by the printed circuit board.

In step S400, the total number n of first signal lines through which signals need to be transmitted along the printed circuit board among the chip scale packages are determined based on characteristics of the chip scale packages to be mounted to and integrated by the printed circuit board. For instance, the total number of address and command signal lines that need to be printed on a substrate are determined. The total number of second signal lines (data lines) through each of which signals need to be transmitted along the printed circuit board to/from only a respective one of the chip scale packages is also determined based on characteristics of the chip scale packages.

In step S500, a receiving terminal layout representing the lands for the chip scale package regions is created. This step involves a laying out to scale of a plurality of first terminal locations on one side of each of the chip scale package regions, and of a plurality of second terminal locations on another side of each of the chip scale package regions spaced from the first terminal locations in a first direction (X) perpendicular to a second direction (Y) in which the chip scale package region locations are spaced from one another.

To lay out the first terminal locations on each said chip scale package region location, the number n of first signal lines necessary is factored to yield factors of n, at least one of which is an even number. Here, the factors of n are designated as c and r, with c being the even number (S510). The first terminal locations are arrayed in a number of rows equal to r, and in a number of columns equal to c, and the row spacing is set to allow at least c/2 of the first signal lines to be printed on the circuit board between adjacent rows of the terminals (lands) formed on the printed circuit board according to the land layout (S520). This layout of first terminal locations is provided at one side of each chip scale package region (S530).

Taking the embodiment of FIG. 12 as an example, the PCB 200 must provide thirty-six first signal lines 40-1, 40-2 to carry the address and command signals to/from the eight chip scale packages. This number thirty-six is factored into factors of c=6 and r=6. The first set of terminals on one layer of the PCB shown in FIG. 12 is arrayed in 6 (c) columns and 6 (r) rows. The rows are spaced to allow c/2, namely three, first signal lines 40-1 to extend between each adjacent pair of rows, in each chip scale package region 42-1 to 42-8. In the embodiment shown in FIG. 17, the factors of 36 are chosen as c=4 and r=9, and the first terminal locations (locations of lands 58) are laid out accordingly in four columns and nine rows.

To lay out the second terminal locations on each said chip scale package region location, a number of the second terminal locations, based on the number of second signal lines determined to be necessary, are arrayed in a plurality of rows and columns. This layout of second terminal locations is provided at the side of each chip scale package region (S540).

Next, a first signal line layout is created, representing locations at which the signal lines are to be formed on the layer of the substrate of the printed circuit board (S600). In this part of the method, at least c/2 first signal line traces passing from one chip scale region location to the other are laid out between each pair of adjacent rows of the first terminal locations, in each said chip scale package region location (S610). Each of the first traces is connected in each of the chip scale package regions with a respective one of the first terminal locations comprising the adjacent rows thereof. In addition, second signal line traces are laid out, each from only a respective one of the second terminal locations (S620).

The signal line traces created in step S600 may represent only some of the the first and only some of the second signal lines traversing the chip scale package region locations. In this case, the signal line layouts are designated for reproduction on an upper outermost surface of the substrate of the printed circuit board. Then, an additional set(s) of signal line layouts (S700) is created to scale, representing the remainder of the first and second signal lines. The additional set(s) of signal line layouts is designated for reproduction on a surface of a layer(s) of the substrate of the printed circuit board other than that constituted by the upper outer surface.

Via hole layouts are then created, one of which represents the locations of via holes to be connected to respective ones of the first and second receiving terminals that are not designated for connection to a signal line on the layer of the PCB at which the chip scale package regions are defined (S800). When all of the signal lines are to be accommodated on only two layers of the PCB, the number of first via hole locations, representing via holes to be connected, respectively, to first lands in each chip scale package region, will be n/2.

Figure 19:
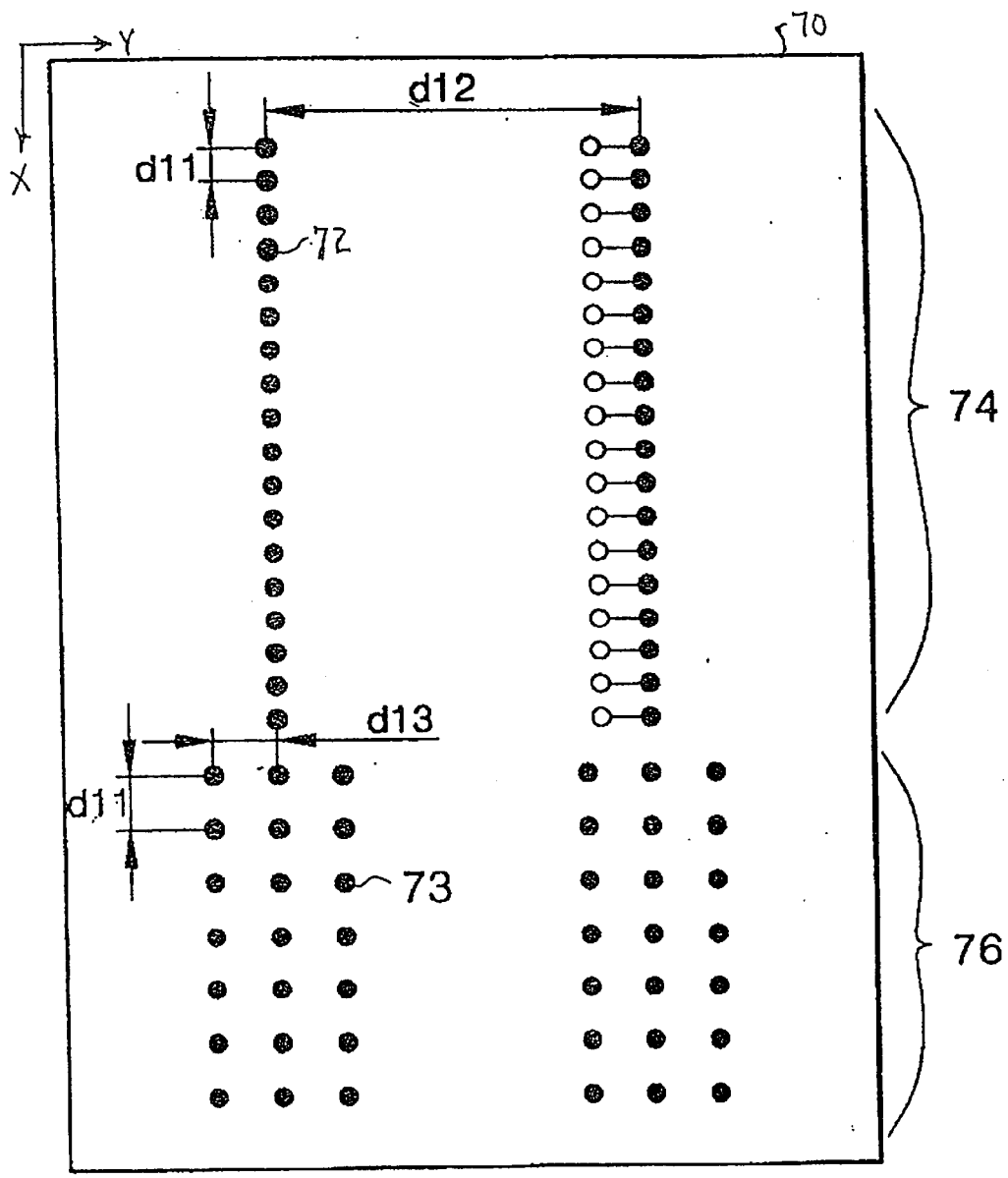
FIG. 19 is a plan view of another chip scale package.
Figure 20:
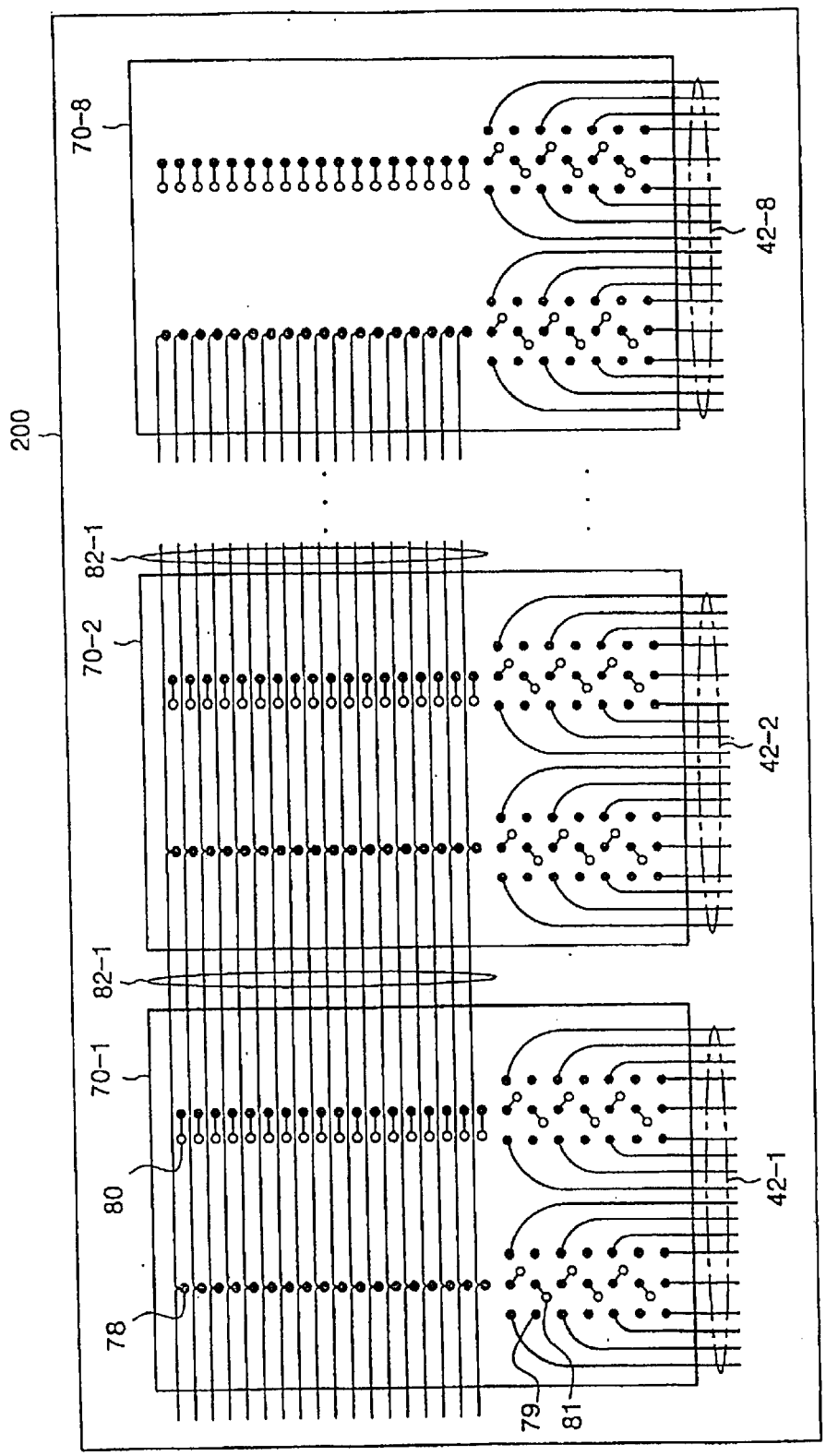
FIG. 20 is a plan view of a first layer of a printed circuit board that can be produced according to a design method of the present invention, and on which chip scale packages of the type shown in FIG. 19 are to be mounted.
Figure 21:
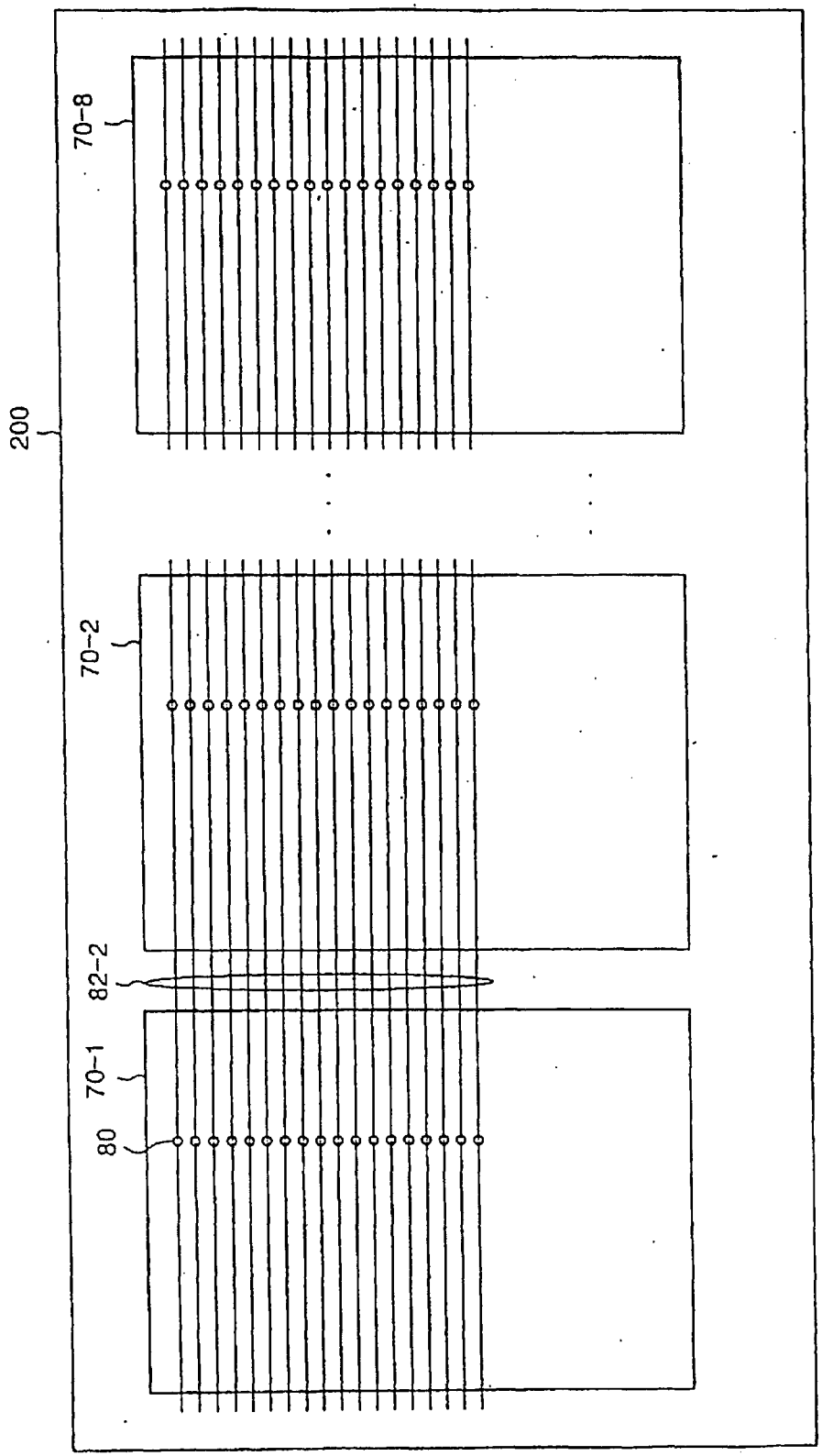
FIG. 21 is a plan view of a fourth layer of the printed circuit board of FIG. 20.

The method of the present invention, as described above, when applied to the design of a PCB for which thirty-six first signal lines are required, can also yield a PCB 200 as shown in FIGS. 20 and 21. This PCB, and the chip scale packages to be mounted thereto, will now be described in more detail with reference to FIGS. 19-21.

As shown in FIG. 19, the chip scale package 70 includes a plurality of first and second sets of balls 72 and 73. The first balls 72 are arranged in two columns at one side 74 of the chip scale package 70. Reference numeral d11 designates the distance between the first balls 72, and d12 the distance between the columns of the first balls 72. The first set of balls 72 are for the transmission of address and command signals.

The second set of balls 73 are arranged in six columns at the other side 76 of the chip scale package 70. Reference numeral d11 represents the distance between the second balls 73 in a first X of two orthogonal directions X and Y, and d13 the distance between the second balls 73 in the second direction Y. The balls 73 are for the inputting/outputting of data signals. In this embodiment, the distance d12 between the adjacent columns of first balls 72 is greater than the distance between adjacent columns of second balls 73, i.e, the spacing of the first set of balls 72 is greater than that of the second set of balls 73 in the second direction Y. On the other hand, the distance d11 between adjacent rows of first balls 72 is the same as the distance d11 between adjacent rows second balls 73, i.e., the spacing is the same in the first direction.

FIGS. 20 and 21 illustrate the configurations of first and fourth layers of the printed circuit board to which the chip scale packages 70 are to be mounted. The configurations of the second and third layers of the printed circuit board are similar to those shown in FIGS. 13 and 14.

As shown in FIG. 20, the first layer includes eight chip scale package regions 70-1 to 70-8 on which the chip scale packages are mounted. Each of the chip scale package regions 70-1 to 70-8 includes two columns of first lands 78, a plurality of columns of second lands 79 and first and second via holes 80 and 81. The lands 78 of the first column are connected with address and command signal lines 82-1. The spacing of the first lands 78 allows only one signal line to pass between adjacent rows of the first lands 78. The second lands 79 are connected with the data lines 42-1 to 42-8 similar to the manner shown in and described with respect to FIG. 10.

Next, as shown in FIG. 21, the fourth layer includes first and second via holes 80 and 81 that are connected with the first and second via holes 80 and 81 in the first layer shown in FIG. 20. The first via holes 80 in the fourth layer are connected with the address and command signal lines 82-2.

In this case, the number of first signal lines required (thirty-six) was factored into c=2 and r=18, and the first lands were laid out accordingly in eighteen rows and two columns. The formulaic spacing (c/2) allows for only one first signal line 82-1 to pass between each adjacent pair of rows of first lands 78. However, like the printed circuit boards of FIGS. 12 and 17, all thirty-six first signal lines are accommodated on only two layers of the PCB.

As described hereinabove, the present invention provides a chip scale package and a printed circuit board having external terminal and land configurations, respectively, that allow the necessary signal lines of the printed circuit board to be arranged efficiently. Thus, the number of the layers of the printed circuit board can be minimized, and the production costs thereof can be kept low.

Finally, although the present invention has been shown and described with particular reference to the preferred embodiments thereof, various modifications thereof will become apparent those skilled in the art. For example, although the external terminals of the chip scale packages have been described as balls or pins, the terminals are not so limited. Also, note, the order in which the steps of the method of the present invention have been described is not particularly limiting. Therefore, all such modifications are seen to be within the true spirit and scope of the invention as defined by the appended claims.

What is claimed is:

1. A chip scale package, comprising:
   a package body having a bottom surface, the bottom surface including upper and lower surface regions aligned on opposite sides of the bottom surface;
   an electronic chip supported by an upper surface of said package body; and
   external signal terminals electrically connected to said electronic chip and extending through said package body from the upper surface to the lower surface so as to project from the bottom surface of said package body, said external signal terminals including a first set of terminals which transmit first signals of the electronic chip and which project from the upper surface region of the bottom surface, and a second set of terminals which transmit second signals of the electronic chip and which project from the lower surface region of the bottom surface, wherein a signal frequency of the first signals is lower than a signal frequency of the second signals, and wherein an average spacing between the first set of terminals is greater than an average spacing between the second set of terminals.

2. The chip scale package of claim 1, wherein the first signals are address and command signals of the electronic chip, and wherein the second signals are data signals of the electronic chip.

3. The chip-scale package as claimed in claim 1, wherein the first set of terminals project in a two-dimensional array from the upper surface region of the bottom surface of the package body, and the second set of terminal project in a two-dimensional array from the lower surface region of the bottom surface of the package body.

4. A chip scale package, comprising:
   a package body having a bottom surface, the bottom surface including upper and lower surface regions aligned on opposite sides of the bottom surface, wherein a boundary between the upper and lower surface regions extends in a first direction;
   an electronic chip supported by said package body; and
   external signal terminals electrically connected to said electronic chip and projecting from the bottom surface of said package body, said external signal terminals including a first set of terminals projecting from the upper surface region of the bottom surface, and a second set of terminals projecting from the lower surface region of the bottom surface;
   wherein the first set of terminals are arrayed on the upper surface region in a plurality of rows which extend in the first direction and which are spaced apart in a second direction at a first average pitch, and in a plurality of columns which extend in the second direction and which are spaced apart in the first direction at a second average pitch, the second direction perpendicular to the first direction;
   wherein the second set of terminals are arrayed on the lower surface region, below the first set of terminals, in a plurality of rows which extend in the first direction and which are spaced apart in the second direction at a third average pitch, and in a plurality of columns which extend in the second direction and which are spaced apart in the first direction at a fourth average pitch;
   wherein at least one of (a) the first average pitch is greater than the third average pitch, and (b) the second average pitch is greater than the fourth average pitch.

5. The chip scale package of claim 4, wherein both (a) the first average pitch is greater than the third average pitch, and (b) the second average pitch is greater than the fourth average pitch.

6. The chip scale package of claim 4, wherein the first set of terminals transmit address and command signals of the electronic chip, and the second set of terminals transmit data signals of the electronic chip.

7. The chip scale package of claim 5, wherein the first set of terminals transmit address and command signals of the electronic chip, and the second set of terminals transmit data signals of the electronic chip.

8. The chip scale package of claim 4, wherein a number of columns of the first set of terminals is the same as a number of columns of the second set of terminals.

9. The chip scale package of claim 4, wherein a number of columns of the first set of terminals is less than a number of columns of the second set of terminals.

10. A printed circuit board for integrating chip scale packages, the printed circuit board comprising:
    a substrate body including a main surface, the main surface having a plurality of linearly spaced-apart chip scale package regions over which the chip scale packages are to be respectively mounted, wherein the chip scale package regions each include upper and lower surface regions aligned on opposite sides of the chip scale package regions, and wherein the upper and lower surface regions are overlapped by a respective chip scale package when the respective chip scale package is mounted thereon; and
    a plurality of receiving terminals of electrically conductive material disposed at each of said chip scale package regions;
    wherein said receiving terminals at each of said chip scale package regions include a first set of terminals which transmit first signals and which project from the upper surface region of each chip scale package region, and a second set of terminals which transmit second signals and which project from the lower surface region of each chip scale package region, wherein a signal frequency of the first signals is lower than a signal frequency of the second signals, and wherein an average spacing between the first set of terminals is greater than an average spacing between the second set of terminals.

11. The printed circuit board of claim 10, wherein the first signals are address and command signals, and wherein the second signals are data signals.

12. The printed circuit board as claimed in claim 10, wherein the first set of terminals project in a two-dimensional array from the upper surface region of each chip scale package region, and the second set of terminals project in a two-dimensional array from the lower surface region of each chip scale package region.

13. A printed circuit board for integrating chip scale packages, the printed circuit board comprising:
  a substrate body including a main surface, the main surface having a plurality of linearly spaced-apart chip scale package regions over which the chip scale packages are to be respectively mounted, wherein the chip scale package regions each include upper and lower surface regions aligned on opposite sides of the chip scale package regions, wherein a boundary between the upper and lower surface regions extends in a first direction; and
  a plurality of receiving terminals of electrically conductive material are disposed at each of said chip scale package regions;
  wherein said receiving terminals at each of said chip scale package regions include a first set of terminals projecting from the upper surface region, and a second set of terminals projecting from the lower surface region;
  wherein the first set of terminals are arrayed on the upper surface region in a plurality of rows which extend in the first direction and which are spaced apart in a second direction at a first average pitch, and in a plurality of columns which extend in the second direction and which are spaced apart in the first direction at a second average pitch, the second direction perpendicular to the first direction;
  wherein the second set of terminals are arrayed on the lower surface region, below the first set of terminals, in a plurality of rows which extend in the first direction and which are spaced apart in the second direction at a third average pitch, and in a plurality of columns which extend in the second direction and which are spaced apart in the first direction at a fourth average pitch;
  wherein at least one of (a) the first average pitch is greater than the third average pitch, and (b) the second average pitch is greater than the fourth average pitch.

14. The printed circuit board of claim 13, wherein both (a) the first average pitch is greater than the third average pitch, and (b) the second average pitch is greater than the fourth average pitch.

15. The printed circuit board of claim 14, wherein the first set of terminals transmit address and command signals, and the second set of terminals transmit data signals.

16. The printed circuit board of claim 13, wherein the first set of terminals transmit address and command signals, and the second set of terminals transmit data signals.

17. The printed circuit board of claim 13, wherein a number of columns of the first set of terminals is the same as a number of columns of the second set of terminals.

18. The printed circuit board of claim 13, wherein a number of columns of the first set of terminals is less than a number of columns of the second set of terminals.

19. The printed circuit board of claim 13, further comprising:
  a first set of signal lines each extending in the first direction and each commonly connected to at least one of the first set of terminals of each chip scale package region; and
  a second set of signal lines extending in the second direction and each individually connected to a respective one of the second set of terminals.

20. The printed circuit board of claim 19, wherein c/2 of said first signal lines extend between each adjacent pair of the rows of the first set of terminals in each of the chip scale package regions, where c is an integer equal to a number of columns of the first set of terminals in each of the chip scale package regions.

21. An electronics module comprising:
  a printed circuit board having a substrate body including a main surface, the main surface having a plurality of linearly spaced-apart chip scale package regions; and
  a plurality of chip scale packages mounted to said chip scale package regions of said printed circuit board, respectively;
  wherein each of said chip scale packages comprises (a) a package body having a bottom surface, the bottom surface including upper and lower surface regions aligned on opposite sides of the bottom surface, (b) an electronic chip supported by said package body, and (c) external signal terminals electrically connected to said electronic chip and projecting from the bottom surface of said package body, said external signal terminals including a first set of terminals which transmit address and command signals of the electronic chip and which project from the upper surface region of the bottom surface, and a second set of terminals which transmit data signals of the electronic chip and which project from the lower surface region of the bottom surface, wherein a average spacing between the first set of terminals is greater than an average spacing between the second set of terminals;
  and wherein each chip scale package region of said printed circuit board includes a receiving terminal for each of the first and second sets of terminals of said chip scale package.

22. The electronics module of claim 21, wherein the first signals are address and command signals of the electronic chip, and wherein the second signals are data signals of the electronic chip.

23. An electronics module comprising:
  a printed circuit board having a substrate body including a main surface, the main surface having a plurality of linearly spaced-apart chip scale package regions; and
  a plurality of chip scale packages mounted to said chip scale package regions of said printed circuit board, respectively;
  wherein each of said chip scale packages comprises (a) a package body having a bottom surface, the bottom surface including upper and lower surface regions aligned on opposite sides of the bottom surface, wherein a boundary between the upper and lower surface regions extends in a first direction, (b) an electronic chip supported by said package body, and (c) external signal terminals electrically connected to said electronic chip and projecting from the bottom surface of said package body, said external signal terminals including a first set of terminals projecting from the upper surface region of the bottom surface, and a second set of terminals projecting from the lower surface region of the bottom surface:
  wherein the first set of terminals are arrayed on the upper surface region in a plurality of rows which extend in the first direction and which are spaced apart in a second direction at a first average pitch, and in a plurality of columns which extend in the second direction and which are spaced apart in the first direction at a second average pitch, the second direction perpendicular to the first direction;

wherein the second set of terminals are arrayed on the lower surface region, below the first set of terminals, in a plurality of rows which extend in the first direction and which are spaced apart in the second direction at a third average pitch, and in a plurality of columns which extend in the second direction and which are spaced apart in the first direction at a fourth average pitch;

wherein at least one of (a) the first average pitch is greater than the third average pitch, and (b) the second average pitch is greater than the fourth average pitch; and and wherein each chip scale package region of said printed circuit board includes a receiving terminal for each of the first and second sets of terminals of said chip scale package.

24. The electronics module of claim 23, wherein both (a) the first average pitch is greater than the third average pitch, and (b) the second average pitch is greater than the fourth average pitch.

25. The electronics module of claim 24, wherein the first set of terminals transmit address and command signals of the electronic chip, and the second set of terminals transmit data signals of the electronic chip.

26. The electronics module of claim 23, wherein the first set of terminals transmit address and command signals of the electronic chip, and the second set of terminals transmit data signals of the electronic chip.

27. The electronics module of claim 23, wherein a number of columns of the first set of terminals is the same as a number of columns of the second set of terminals.

28. The electronics module of claim 23, wherein a number of columns of the first set of terminals is less than a number of columns of the second set of terminals.

29. The electronics module of claim 23, further comprising:
a first set of signal lines each extending in the first direction and each commonly connected to at least one of the first set of terminals of each chip scale package region; and
a second set of signal lines extending in the second direction and each individually connected to a respective one of the second set of terminals.

30. The electronics module of claim 29, wherein c/2 of said first signal lines extend between each adjacent pair of the rows of the first set of terminals in each of the chip scale package regions, where c is an integer equal to a number of columns of the first set of terminals in each of the chip scale package regions.

31. A method of designing a printed circuit board having a plurality of layers for use in integrating a plurality of chip scale packages, the method comprising:
creating a chip scale package region layout to scale for one of the layers of the printed circuit board;
determining a total number n of first signal lines through which signals are to be transmitted along the printed circuit board among chip scale packages mounted over the chip scale package regions, respectively;
creating a receiving terminal layout of a plurality of first terminal locations (lands) in each chip scale package region by factoring the number n of first signal lines into factors of c and r;
arranging the first terminal locations in a number of rows equal to r in each chip scale package region, and in a number of columns equal to c in each chip scale package region; and
spacing the rows from each other by intervals sufficient to allow at least c/2 of the first signal lines to be printed on the circuit board between adjacent rows of the terminals formed on the printed circuit board according to the receiving terminal layout.

32. A method of designing a printed circuit board having a plurality of layers for use in integrating a plurality of chip scale packages, the method comprising:
creating a chip scale package layout to scale for one of the layers of the printed circuit board, the chip scale package layout comprising a number of linearly spaced apart chip scale package region locations corresponding in size and number to the chip scale packages that are to be mounted to and integrated by the printed circuit board, the chip scale package locations representing regions of the printed circuit board over which the chip scale packages are to be mounted;
determining, based on characteristics of the chip scale packages to be mounted to and integrated by the printed circuit board, the total number n of first signal lines through which signals need to be transmitted along the printed circuit board among the chip scale packages, and the total number of second signal lines through each of which signals need to be transmitted along the printed circuit board to/from only a respective one of the chip scale packages;
creating a receiving terminal layout for said one of the layers by laying out to scale a plurality of first terminal locations on one side of each of the chip scale package region locations, and a plurality of second terminal locations on another side of each of the chip scale package region locations spaced from said one side in a first direction perpendicular to a second direction in which the chip scale package region locations are linearly spaced from one another,
said laying out of said plurality of first terminal locations on each said chip scale package region locations comprising factoring said number n to yield factors of n which are c and r, c being said even number, arranging the first terminal locations in a number of adjacent rows equal to r as spaced from one another in said first direction, and in a number of adjacent columns equal to c and spaced from one another in said second direction, and spacing the adjacent rows from each other by intervals sufficient to allow at least c/2 of the first signal lines to be printed on the circuit board between adjacent rows of the terminals formed on the printed circuit board according to said terminal layout, and
said laying out of said plurality of second terminal locations on each said chip scale package region location comprising arranging, based on the number of said second signal lines determined to be necessary, a number of the second terminal locations in a plurality of adjacent rows spaced from one another in said first direction, and a plurality of adjacent columns spaced from one another in said second direction; and
creating a first signal line layout to scale, representing locations at which the first signal lines are to be formed on said one of the layers of the substrate of the printed circuit board, by laying out between each pair of adjacent rows of the first terminal locations, in each said chip scale package region location, at least c/2 first signal line traces passing from one chip scale region location to the other and each of which traces is connected in each of the chip scale package regions with a respective one of the first terminal locations comprising the adjacent rows thereof; and creating a second signal line layout to scale, representing locations at which at least some of the second signal lines are to be formed on said one of the layers of the substrate of the printed circuit board, by laying out second signal line traces each from only a respective one of said second terminal locations.

33. The method of claim 32, wherein the creating of the first and second signal line layouts comprises laying out signal line traces representing only some of the first and only some of the second signal lines on said chip scale package region locations, and designating said signal line layouts for reproduction on an upper outermost surface of the substrate of the printed circuit board, and further comprising creating an additional set of signal line layouts to scale of traces representing the remainder of the first and second signal lines, and designating the additional set of signal line layouts for reproduction on a surface of one of the layers of the substrate of the printed circuit board other than said upper outer surface.

34. The method of claim 33, wherein the additional set of signal line layouts is designated for reproduction on the lower outer surface of the substrate of the printed circuit board.

* * * * *